(12) United States Patent
Mitsuno et al.

(10) Patent No.: US 11,721,625 B2
(45) Date of Patent: Aug. 8, 2023

(54) SEMICONDUCTOR STORAGE DEVICE AND MANUFACTURING METHOD THEREOF

(71) Applicant: Kioxia Corporation, Tokyo (JP)

(72) Inventors: Yosuke Mitsuno, Yokkaichi Mie (JP); Tatsufumi Hamada, Nagoya Aichi (JP); Shinichi Sotome, Yokkaichi Mie (JP); Tomohiro Kuki, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 164 days.

(21) Appl. No.: 17/190,713

(22) Filed: Mar. 3, 2021

(65) Prior Publication Data

US 2021/0366830 A1 Nov. 25, 2021

(30) Foreign Application Priority Data

May 19, 2020 (JP) ................................ 2020-087668

(51) Int. Cl.
| | | |
|---|---|---|
| *H01L 23/528* | (2006.01) | |
| *H10B 41/27* | (2023.01) | |
| *H10B 43/27* | (2023.01) | |
| *H01L 21/768* | (2006.01) | |
| *H01L 23/522* | (2006.01) | |

(52) U.S. Cl.
CPC .... *H01L 23/5283* (2013.01); *H01L 21/76804* (2013.01); *H01L 23/5226* (2013.01); *H10B 41/27* (2023.02); *H10B 43/27* (2023.02)

(58) Field of Classification Search
CPC ......... H01L 27/11556; H01L 27/11582; H01L 27/11568; H01L 27/11521; H01L 23/5283; H01L 23/5226; H01L 21/76804
See application file for complete search history.

(56) References Cited

U.S. PATENT DOCUMENTS

| | | |
|---|---|---|
| 2010/0019310 A1 | 1/2010 | Sakamoto |
| 2018/0277631 A1 | 9/2018 | Okumura |
| 2019/0027495 A1* | 1/2019 | Choi ................... H01L 23/5283 |
| 2019/0123055 A1 | 4/2019 | Matsumura |

(Continued)

FOREIGN PATENT DOCUMENTS

| | | |
|---|---|---|
| TW | 201814872 A | 4/2018 |
| TW | 201843816 A | 12/2018 |
| TW | 201931578 A | 8/2019 |

*Primary Examiner* — Galina G Yushina
(74) *Attorney, Agent, or Firm* — Foley & Lardner LLP

(57) ABSTRACT

A semiconductor storage device includes: conductive layers arranged in a first direction; a first insulating layer extending in the first direction; a first semiconductor layer between the conductive layers and the first insulating layer; and a gate insulating film between the conductive layers and the first semiconductor layer. The first semiconductor layer includes a first region between a first insulating portion and the first conductive layer, a second region between a second insulating portion and the second conductive layer, and a third region between the first region and the second region. The third region includes a fourth region extending in a second direction, a fifth region between the first region and the fourth region, a sixth region between the second region and the fourth region, and a seventh region between the fifth region and the first region and extending in the first direction.

7 Claims, 41 Drawing Sheets

(56) References Cited

U.S. PATENT DOCUMENTS

| | | | | |
|---|---|---|---|---|
| 2019/0198521 A1* | 6/2019 | Komiya | ................. | H10B 41/10 |
| 2019/0198522 A1* | 6/2019 | Takekida | ................ | G11C 16/28 |
| 2019/0214405 A1* | 7/2019 | Shirai | ............... | H01L 29/40117 |
| 2020/0279861 A1* | 9/2020 | Uryu | ....................... | H10B 43/40 |
| 2020/0312863 A1* | 10/2020 | Iwai | ....................... | H10B 43/10 |
| 2021/0159149 A1* | 5/2021 | Kitazawa | ............... | H10B 43/10 |

* cited by examiner

SEMICONDUCTOR STORAGE DEVICE AND MANUFACTURING METHOD THEREOF

CROSS-REFERENCE TO RELATED APPLICATION(S)

This application is based upon and claims the benefit of priority from Japanese Patent Application No. 2020-087668, filed on May 19, 2020, the entire contents of which are incorporated herein by reference.

FIELD

Embodiments described herein relate generally to a semiconductor storage device and a manufacturing method thereof.

BACKGROUND

A semiconductor storage device generally includes a substrate, a plurality of conductive layers arranged in a first direction intersecting with a front surface of the substrate, a semiconductor layer extending in the first direction, and a gate insulating film provided between the plurality of conductive layers and the first semiconductor layer.

DETAILED DESCRIPTION

Figure 1:
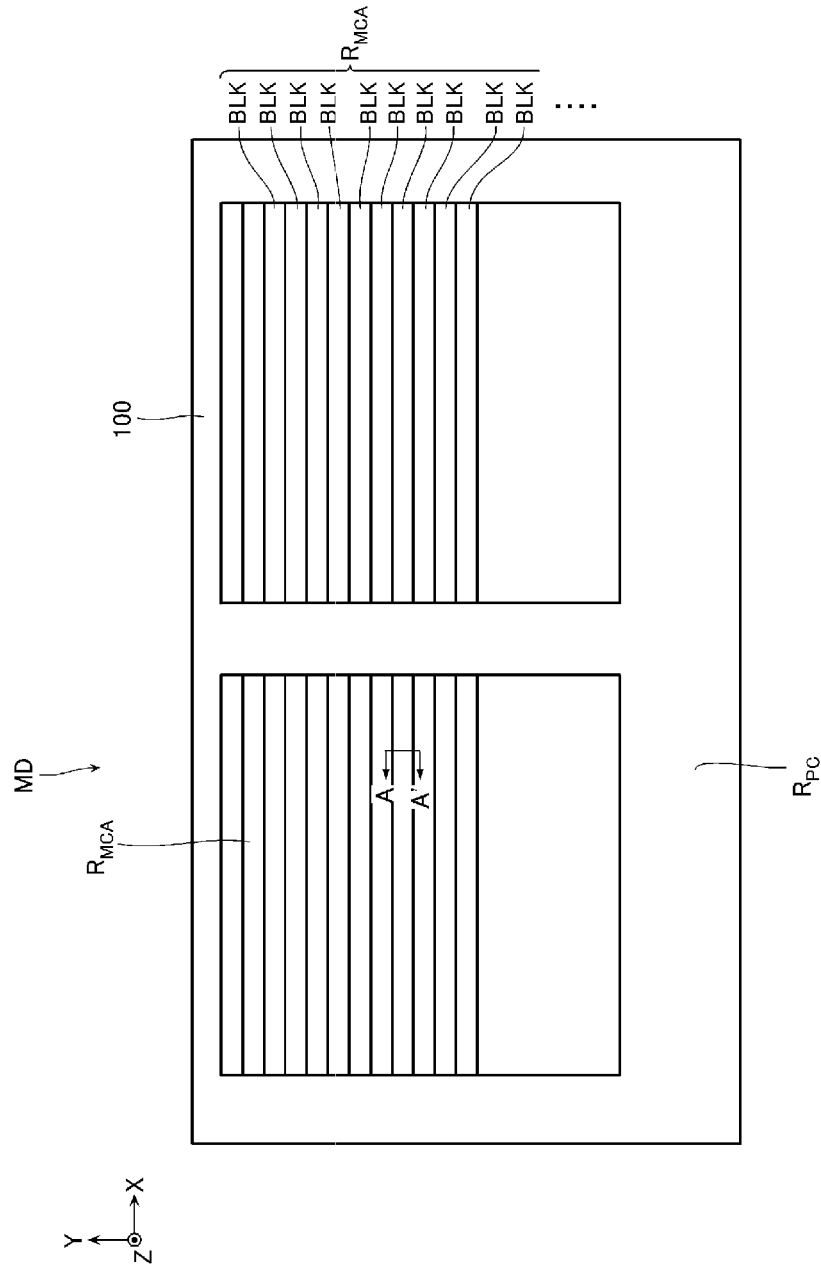
FIG. 1 is a schematic plan view of a memory die according to a first configuration example.

Embodiments provide a semiconductor storage device that has suitable characteristics and can be properly manufactured, and a manufacturing method thereof.

In general, according to one embodiment, a semiconductor storage device includes: a substrate; a plurality of conductive layers arranged in a first direction intersecting with a surface of the substrate; a first insulating layer extending in the first direction; a first semiconductor layer provided between the plurality of conductive layers and the first insulating layer; and a gate insulating film provided between the plurality of conductive layers and the first semiconductor layer. A cross-section, extending in the first direction and a second direction intersecting with the first direction, in part includes a first one and a second one of the plurality of conductive layers that are adjacent to each other in the first direction, the first insulating layer, the first semiconductor layer, and the gate insulating film. The first insulating layer includes: a first insulating portion having a first width in the second direction, and a second insulating portion that has a second width smaller than the first width in the second direction, and is separated from the first insulating portion in the first direction. The first semiconductor layer includes a first region provided between the first insulating portion and the first conductive layer, a second region provided between the second insulating portion and the second conductive layer, and a third region provided between the first region and the second region. The third region includes a fourth region extending in the second direction, a fifth region provided between the first region and the fourth region, a sixth region provided between the second region and the fourth region, and a seventh region provided between the fifth region and the first region and extending in the first direction. The first region of the first semiconductor layer has a first thickness from a surface on a side of the first insulating layer to the gate insulating film. The second region of the first semiconductor layer has a second thickness from a surface on the side of the first insulating layer to the gate insulating film. The seventh region of the first semiconductor layer has a third thickness from a surface on the side of the first insulating layer to the gate insulating film. A surface in the fifth region on the side of the first insulating layer includes a region with a shortest distance to the gate insulating film larger than the first thickness, the second thickness, and the third thickness. A shortest distance to the gate insulating film from a surface in the sixth region on the side of the first insulating layer is larger than the first thickness minus 2 nm and is larger than the second thickness minus 2 nm.

A manufacturing method according to one embodiment includes: forming alternately a plurality of first layers and a plurality of second layers on a substrate; forming a first through via hole through the plurality of first layers and the plurality of second layers; forming alternately a plurality of third layers and a plurality of fourth layers on the plurality of first layers and the plurality of second layers; forming a second through via hole communicating with the first through via hole, through the plurality of third layers and the plurality of fourth layers; forming a gate insulating film and a first semiconductor layer on inner peripheral surfaces of the first through via hole and the second through via hole; and forming a first oxide film by performing oxidation treatment on the first semiconductor layer.

Next, the semiconductor storage device according to embodiments will be described in detail with reference to drawings. The following embodiments are merely examples, and are described without the intention of limiting the present disclosure. The following drawings are schematic, and for convenience of explanation, some configurations may be omitted. Parts common to the plurality of embodiments may be denoted by the same reference numerals, and descriptions thereof may be omitted.

The "semiconductor storage device" disclosed in the present specification may refer to a memory die, or a memory system including a control die, such as a memory chip, a memory card, or a solid state drive (SSD). Also, the "semiconductor storage device" may refer to a configuration including a host computer, such as a smartphone, a tablet terminal, or a personal computer.

In the present specification, when a first configuration is said to be "electrically connected" to a second configuration, the first configuration may be directly connected to the second configuration, or the first configuration may be connected to the second configuration via wiring, a semiconductor member, or a transistor. For example, when three transistors are connected in series, even if a second transistor is in the OFF state, a first transistor is "electrically connected" to a third transistor.

In the present specification, a predetermined direction parallel to an upper surface of a substrate is referred to as an X direction, a direction parallel to the upper surface of the substrate and perpendicular to the X direction is referred to as a Y direction, and a direction perpendicular to the upper surface of the substrate is referred to as a Z direction.

In the present specification, a direction that follows a predetermined plane may be referred to as a first direction, a direction that follows the predetermined plane and intersects with the first direction may be referred to as a second direction, and a direction intersecting with the predetermined plane may be referred to as a third direction. The first direction, the second direction, and the third direction may or may not correspond to any of the X direction, the Y direction, and the Z direction.

In the present specification, the expression such as "upper" or "lower" is based on a substrate. For example, a direction away from the substrate, along the Z direction, is referred to as upper, and a direction getting closer to the substrate, along the Z direction, is referred to as lower. The lower surface or the lower end mentioned in regard to a certain configuration means the surface or the end portion on the substrate side in the configuration, and the upper surface or the upper end means the surface or the end portion on the opposite side to the substrate in the configuration. A surface intersecting with the X direction or the Y direction is referred to as a side surface.

In the present specification, a "radial direction" mentioned in regard to a cylindrical or annular member, or a through via hole may mean a direction getting closer to the central axis or a direction away from the central axis in a plane perpendicular to the central axis of this cylinder or ring. The "thickness in the radial direction" may mean a difference between a distance from the central axis to the inner peripheral surface and a distance from the central axis to the outer peripheral surface, in this plane.

First Configuration Example

[Structure of Memory Die MD]

FIG. 1 is a schematic plan view of a memory die MD according to a first configuration example. As illustrated in FIG. 1, the memory die MD includes a semiconductor substrate 100. In the illustrated example, the semiconductor substrate 100 is provided with two memory cell array regions $R_{MCA}$ arranged in the X direction. In the memory cell array region $R_{MCA}$, a plurality of memory block structures BLK is provided while arranged in the Y direction. Each of these memory block structures BLK includes a plurality of memory cells. At the end portion of the semiconductor substrate 100 in the Y direction, a peripheral circuit region $R_{PC}$ is provided while extending in the X direction. A control circuit that supplies, for example, voltages to the memory cells is provided in the peripheral circuit region $R_{PC}$.

Figure 2:
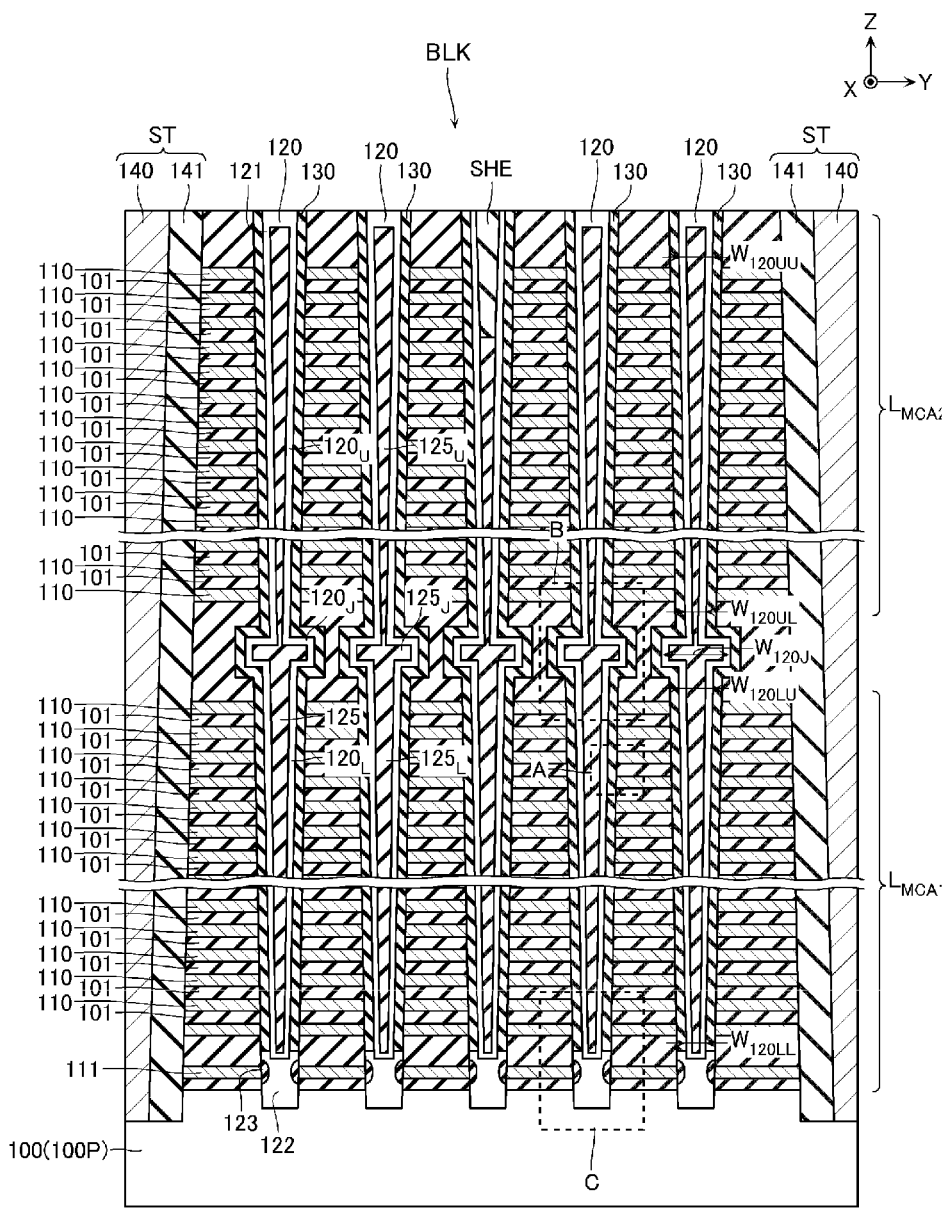
FIG. 2 is a schematic sectional view of the structure illustrated in FIG. 1, which is taken along the line A-A', and seen in the arrow direction.

FIG. 2 is a schematic sectional view of the structure illustrated in FIG. 1, which is taken along the line A-A', and seen in the arrow direction. As illustrated in FIG. 2, a memory cell array layer $L_{MCA1}$ is provided above the semiconductor substrate 100. A memory cell array layer $L_{MCA2}$ is provided above the memory cell array layer $L_{MCA1}$. In the memory cell array layer $L_{MCA1}$ and the memory cell array layer $L_{MCA2}$, the plurality of memory block structures BLK is provided while arranged in the Y direction. A contact structure ST is provided between two memory block structures BLK adjacent in the Y direction.

The semiconductor substrate 100 is a semiconductor substrate made of, for example, P-type silicon (Si) containing a P-type impurity such as boron (B). On the front surface of the semiconductor substrate 100, for example, a P-type well region 100P containing a P-type impurity is provided.

The memory block structure BLK includes a plurality of conductive layers 110 arranged in the Z direction, a plurality of semiconductor layers 120 extending in the Z direction, and a plurality of gate insulating films 130 provided between the plurality of conductive layers 110, and the plurality of semiconductor layers 120.

The conductive layer 110 is a substantially plate-shaped conductive layer extending in the X direction. The conductive layer 110 functions as a word line, a gate electrode of a memory cell, and the like. The conductive layer 110 may include a stacked film of a barrier conductive film of titanium nitride (TiN) or the like and a metal film of tungsten (W) or the like. The conductive layer 110 may contain, for example, polycrystalline silicon which contains an impurity such as phosphorous (P) or boron (B). Insulating layers 101 of silicon oxide ($SiO_2$) are provided between the conductive layers 110 arranged in the Z direction.

A conductive layer 111 is provided below the conductive layers 110. The conductive layer 111 may include, for example, a stacked film of a barrier conductive film of titanium nitride (TiN) and a metal film of tungsten (W). The insulating layer 101 of silicon oxide ($SiO_2$) is provided between the conductive layer 111 and the conductive layer 110.

The semiconductor layers 120 are arranged with a predetermined pattern in the X direction and the Y direction. The semiconductor layer 120 functions as a channel region of a plurality of memory cells. The semiconductor layer 120 is a semiconductor layer of, for example, polycrystalline silicon (Si). The semiconductor layer 120 has a substantially bottomed-cylindrical shape, and an insulating layer 125 of silicon oxide is provided in the central portion.

The semiconductor layer 120 includes a region $120_L$ in the memory cell array layer $L_{MCA1}$, and a region $120_U$ in the memory cell array layer $L_{MCA2}$. The semiconductor layer 120 includes a region $120_J$ provided between the upper end of the region $120_L$ and the lower end of the region $120_U$, and an impurity region 121 provided in the upper portion in the region $120_U$. A semiconductor layer 122 is provided in the lower portion in the region $120_L$.

The region $120_L$ is a substantially cylindrical region extending in the Z direction. The outer peripheral surface of the region $120_L$ is surrounded by each of the conductive layers 110 in the memory cell array layer $L_{MCA1}$, and faces these conductive layers 110. The radial width $W_{120LL}$ of the lower end of the region $120_L$ (for example, a portion located below the plurality of conductive layers 110 in the memory cell array layer $L_{MCA1}$) is smaller than the radial width $W_{120LU}$ of the upper end of the region $120_L$ (for example, a portion located above the plurality of conductive layers 110 in the memory cell array layer $L_{MCA1}$).

The region $120_U$ is a substantially cylindrical region extending in the Z direction. The outer peripheral surface of the region $120_U$ is surrounded by each of the conductive layers 110 in the memory cell array layer $L_{MCA2}$, and faces these conductive layers 110. The radial width $W_{120UL}$ of the lower end of the region $120_U$ (for example, a portion located below the plurality of conductive layers 110 in the memory cell array layer $L_{MCA2}$) is smaller than the radial width $W_{120UU}$ of the upper end of the region $120_U$ (for example, a portion located above the plurality of conductive layers 110 in the memory cell array layer $L_{MCA2}$) and the width $W_{120LU}$.

The region $120_J$ is provided above the plurality of conductive layers 110 in the memory cell array layer $L_{MCA1}$, and is provided below the plurality of conductive layers 110 in the memory cell array layer $L_{MCA2}$. The radial width $W_{120J}$ of the region $120_J$ is larger than the widths $W_{120LU}$ and $W_{120UU}$.

The impurity region 121 contains, for example, an N-type impurity such as phosphorous (P). The impurity region 121 is connected to a bit line via a contact (not illustrated).

The semiconductor layer 122 is connected to the P-type well region 100P of the semiconductor substrate 100. The semiconductor layer 122 is made of, for example, monocrystalline silicon (Si). The outer peripheral surface of the semiconductor layer 122 is surrounded by the conductive layer 111, and faces the conductive layer 111. An insulating layer 123 of silicon oxide is provided between the semiconductor layer 122 and the conductive layer 111.

The insulating layer 125 includes a region $125_L$ in the memory cell array layer $L_{MCA1}$, and a region $125_U$ in the memory cell array layer $L_{MCA2}$. The insulating layer 125 includes a region $125_J$ provided between the upper end of the region $125_L$ and the lower end of the region $125_U$.

The region $125_L$ is a substantially cylindrical region extending in the Z direction. The outer peripheral surface of the region $125_L$ is surrounded by the region $120_L$ of each of the semiconductor layers 120. The radial width of the lower end of the region $125_L$ (for example, a portion located below the plurality of conductive layers 110 in the memory cell array layer $L_{MCA1}$) is smaller than the radial width of the upper end of the region $125_L$ (for example, a portion located above the plurality of conductive layers 110 in the memory cell array layer $L_{MCA1}$).

The region $125_U$ is a substantially cylindrical region extending in the Z direction. The outer peripheral surface of the region $125_U$ is surrounded by the region $120_U$ of each of the semiconductor layers 120. The radial width of the lower end of the region $125_U$ (for example, a portion located below the plurality of conductive layers 110 in the memory cell array layer $L_{MCA2}$) is smaller than the radial width of the upper end of the region $125_L$, and the radial width of the upper end of the region $125_U$ (for example, a portion located above the plurality of conductive layers 110 in the memory cell array layer $L_{MCA2}$).

The region $125_J$ is provided above the plurality of conductive layers 110 in the memory cell array layer $L_{MCA1}$, and is provided below the plurality of conductive layers 110 in the memory cell array layer $L_{MCA2}$. The radial width $W_{125J}$ of the region $125_J$ is larger than the widths of the upper ends of the regions $125_L$ and $125_U$.

Figure 3:
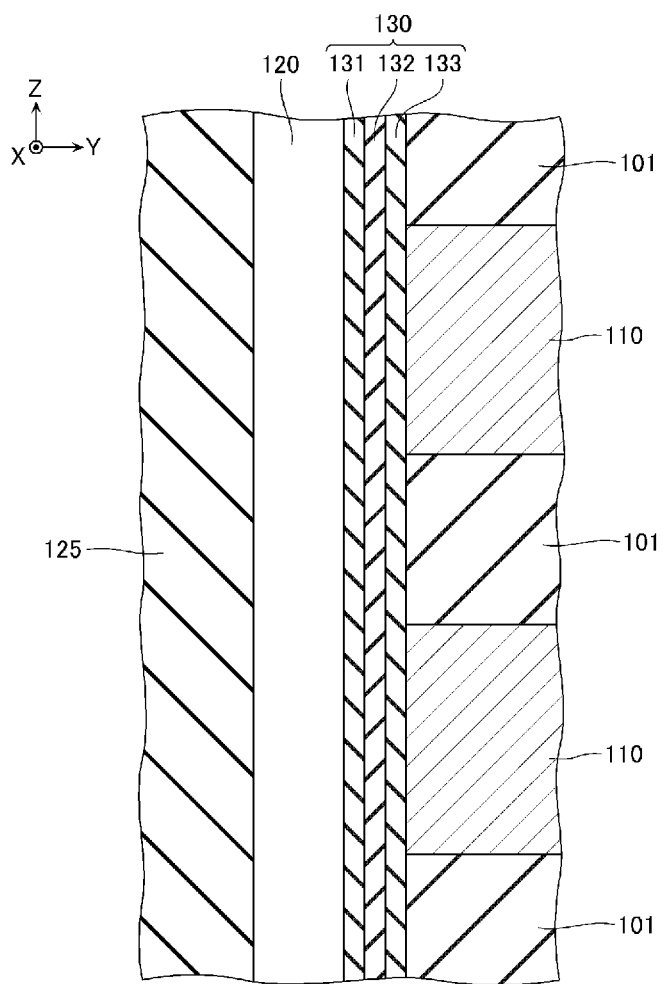
FIG. 3 is a schematic view of a portion indicated by A in FIG. 2, in an enlarged scale.

The gate insulating film 130 has a substantially cylindrical shape that covers the outer peripheral surface of the semiconductor layer 120. For example, as illustrated in FIG. 3, the gate insulating film 130 includes a tunnel insulating film 131, a charge storage film 132, and a block insulating film 133, which are stacked between the semiconductor layer 120 and the conductive layers 110. The tunnel insulating film 131 and the block insulating film 133 are, for example, insulating films of silicon oxide ($SiO_2$). The charge storage film 132 is, for example, a film of silicon nitride ($Si_3N_4$), which is capable of storing charges. The tunnel insulating film 131, the charge storage film 132, and the block insulating film 133 have substantially cylindrical shapes, and extend in the Z direction along the outer peripheral surface of the semiconductor layer 120. In the example illustrated in FIG. 3, the gate insulating film 130 includes the insulating charge storage film 132 of silicon nitride. However, the gate insulating film 130 may include, for example, a floating gate of polycrystalline silicon, which contains an N-type or P-type impurity.

For example, as illustrated in FIG. 2, the contact structure ST includes a conductive layer 140 extending in the Z direction and the X direction, and an insulating layer 141 provided on the side surface of the conductive layer 140. The conductive layer 140 is connected to an N-type impurity region provided in the P-type well region 100P of the semiconductor substrate 100. The conductive layer 140 may include, for example, a stacked film of a barrier conductive film of titanium nitride (TiN) and a metal film of tungsten (W). The conductive layer 140 functions as, for example, a part of a source line.

[Thickness of Semiconductor Layer 120]

Figure 4:
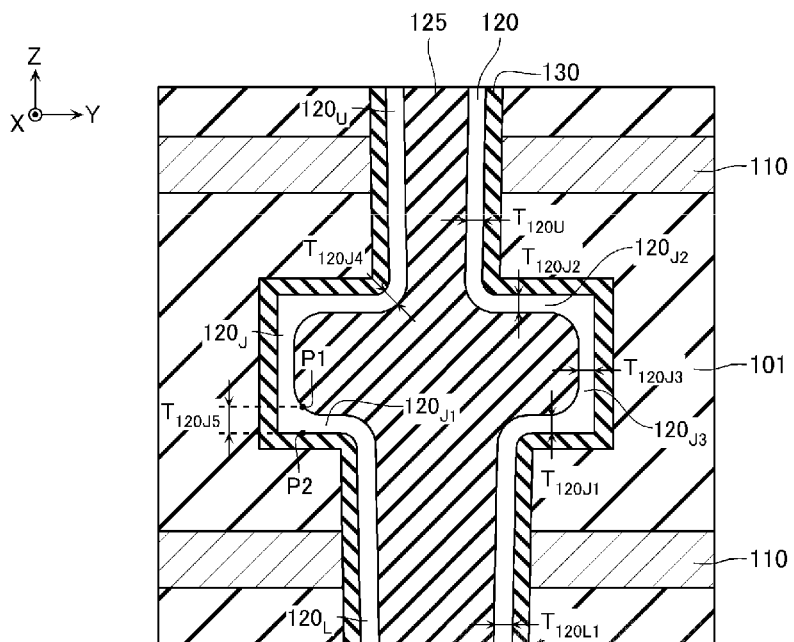
FIG. 4 is a schematic view of a portion indicated by B in FIG. 2, in an enlarged scale.
Figure 5:
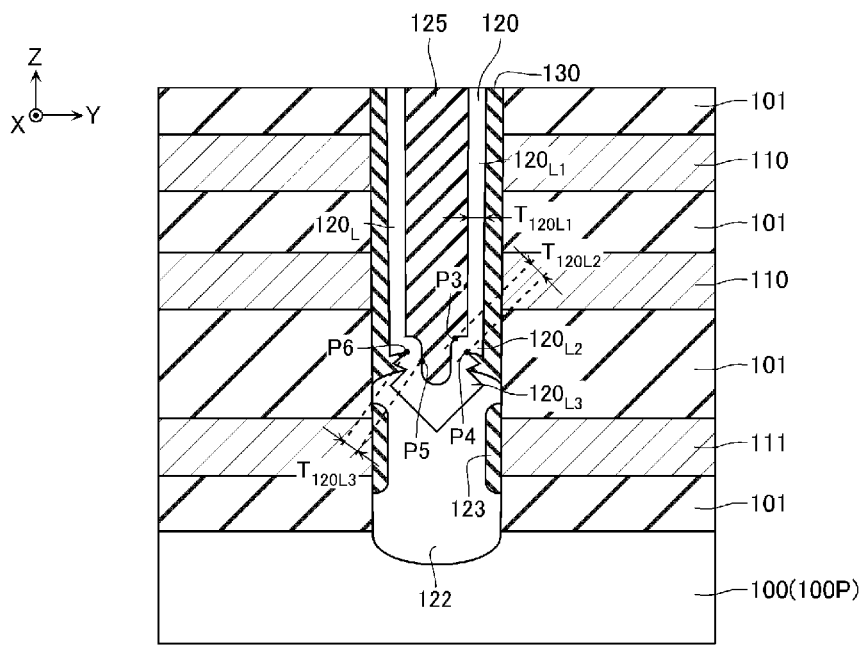
FIG. 5 is a schematic view of a portion indicated by C in FIG. 2, in an enlarged scale.

Next, the thickness of the semiconductor layer 120 will be described with reference to FIGS. 4 and 5. FIG. 4 is a schematic view of a portion indicated by B in FIG. 2, in an enlarged scale. FIG. 5 is a schematic view of a portion indicated by C in FIG. 2, in an enlarged scale.

When the thickness of the semiconductor layer 120 is mentioned in the following description, the thickness can be specified by various methods. For example, it is possible to consider that the memory die MD may be cut so as to expose the cross-section, and then this cross-section may be observed by scanning electron microscopy (SEM), transmission electron microscopy (TEM), or the like. Then, for example, in the observed cross-section, a point may be set on one side surface of the semiconductor layer 120, and the shortest distance from this point to the other side surface of the semiconductor layer 120 may be set as the thickness of the semiconductor layer 120. For example, a normal may be set on one side surface of the semiconductor layer 120, a distance from one side surface of the semiconductor layer 120 to the other side surface may be measured along this normal, and this distance may be set as the thickness of the semiconductor layer 120.

In the example of FIG. 4, the thickness of the semiconductor layer 120 in the region $120_L$ is indicated by $T_{120L1}$. The thickness of the semiconductor layer 120 in the region $120_U$ is indicated by $T_{120U}$. In the illustrated example, the thicknesses $T_{120L1}$ and $T_{120U}$ are the same as each other. For example, these thicknesses may be the same in the range of one-digit or two-digit significant figures.

In the illustrated example, the region $120_J$ of the semiconductor layer 120 includes a substantially linear region $120_{J1}$ extending radially outward from the upper end of the region $120_L$, a substantially linear region $120_{J2}$ extending radially outward from the lower end of the region $120_U$, and a substantially linear region $120_{J3}$ that is provided between these regions $120_{J1}$ and $120_{J2}$ and extends in the Z direction. In the drawing, the thicknesses of the semiconductor layer 120 in these regions $120_{J1}$, $120_{J2}$, and $120_{J3}$ are indicated by $T_{120J1}$, $T_{120J2}$, and $T_{120J3}$, respectively. In the illustrated example, these thicknesses $T_{120J1}$, $T_{120J2}$, and $T_{120J3}$ are the same as the above described thicknesses $T_{120L1}$ and $T_{120U}$. For example, these thicknesses may be the same in the range of one-digit or two-digit significant figures.

In the illustrated example, the thickness of the semiconductor layer 120 in a portion provided between the region $120_J$ and the region $120_L$, and the thickness in a portion provided between the region $120_J$ and the region $120_U$ are indicated by $T_{120J4}$. The thickness $T_{120J4}$ may be substantially the same as the thicknesses $T_{120L1}$, $T_{120U}$, $T_{120J1}$, $T_{120J2}$ and $T_{120J3}$, or may be smaller than these thicknesses.

For example, the thickness $T_{120J4}$ may be the same as any of the thicknesses $T_{120L1}$, $T_{120U}$, $T_{120J1}$, $T_{120J2}$, and $T_{120J3}$ in the range of one-digit or two-digit significant figures. The thickness $T_{120J4}$ may be the same as a value obtained by subtracting 2 nm from these thicknesses or may be larger than this value. The thickness $T_{120J4}$ may be the minimum value or the smallest value among the thicknesses of the semiconductor layer 120.

In the illustrated example, the thickness of the semiconductor layer 120 in a portion provided between the region $120_{J1}$ and the region $120_{J3}$, and the thickness in a portion provided between the region $120_{J2}$ and the region $120_{J3}$ are indicated by $T_{120J5}$. The thickness $T_{120J5}$ is larger than any of the above described thicknesses $T_{120L1}$, $T_{120U}$, $T_{120J1}$, $T_{120J2}$, $T_{120J3}$, and $T_{120J4}$. For example, the thickness $T_{120J5}$ may be larger than the thicknesses $T_{120L1}$, $T_{120U}$, $T_{120J1}$, $T_{120J2}$, $T_{120J3}$, and $T_{120J4}$ in the range of one-digit or two-digit significant figures. The thickness $T_{120J5}$ may be the maximum value or the largest value among the thicknesses of the semiconductor layer 120. In the illustrated example, a point P1 is set on the inside surface of the semiconductor layer 120 (on the side of the insulating layer 125), and a point P2 is set for a point at which a distance to the point P1 is minimized on the outside surface of the semiconductor layer 120 (on the side of the conductive layer 110 and the insulating layer 101), so that the distance between the point P1 and the point P2 is set as the thickness $T_{120J5}$.

In the example of FIG. 5, the region $120_L$ of the semiconductor layer 120 includes a region $120_{L1}$ that is provided between the plurality of conductive layers 110 and the insulating layer 125 and extends in the Z direction, a region $120_{L2}$ extending radially inward from the lower end of the region $120_{L1}$, and a region $120_{L3}$ that extends downward from the end of the radial inside of the region $120_{L2}$ and is connected to the upper surface of the semiconductor layer 122. The thickness of the semiconductor layer 120 in the region $120_{L1}$, even in the vicinity of the lower end of the region $120_L$, may be the same as the thickness $T_{120L1}$ in the vicinity of the upper end.

In the illustrated example, the thickness of the semiconductor layer 120 in a portion provided between the region $120_{L2}$ and the region $120_{L3}$ is indicated by $T_{120L2}$. The thickness $T_{120L2}$ may be substantially the same as the thicknesses $T_{120L1}$, $T_{120U}$, $T_{120J1}$, $T_{120J2}$, and $T_{120J3}$, or may be smaller than these thicknesses. For example, the thickness $T_{120L2}$ may be the same as the thickness $T_{120L1}$ in the range of one-digit or two-digit significant figures. The thickness $T_{120L2}$ may be the same as the value obtained by subtracting 2 nm from the thickness $T_{120L1}$, or may be larger than this value. The thickness $T_{120L2}$ may be the minimum value or the smallest value among the thicknesses of the semiconductor layer 120. In the illustrated example, a point P3 is set on the inside surface of the semiconductor layer 120 (on the side of the insulating layer 125), and a point P4 is set for a point at which a distance to the point P3 is minimized on the outside surface of the semiconductor layer 120 (on the side of the conductive layer 110 and the insulating layer 101), so that the distance between the point P3 and the point P4 is set as the thickness $T_{120L2}$.

In the illustrated example, the thickness of the semiconductor layer 120 in the region $120_L$, at a predetermined position within the region $120_{L3}$, is indicated by $T_{120L3}$. The thickness $T_{120L3}$ is larger than any of the above described thicknesses $T_{120L1}$ and $T_{120L2}$. For example, the thickness $T_{120L3}$ may be larger than the thicknesses $T_{120L1}$ and $T_{120L2}$ in the range of one-digit or two-digit significant figures. The thickness $T_{120L3}$ may be the maximum value or the largest value among the thicknesses of the semiconductor layer 120. In the illustrated example, a point P5 is set on the inside surface of the semiconductor layer 120 (on the side of the insulating layer 125), and a point P6 is set for a point at which a distance to the point P5 is minimized on the outside surface of the semiconductor layer 120 (on the side of the conductive layer 110 and the insulating layer 101), so that the distance between the point P5 and the point P6 is set as the thickness $T_{120L3}$.

[Manufacturing Method]

Figure 20:
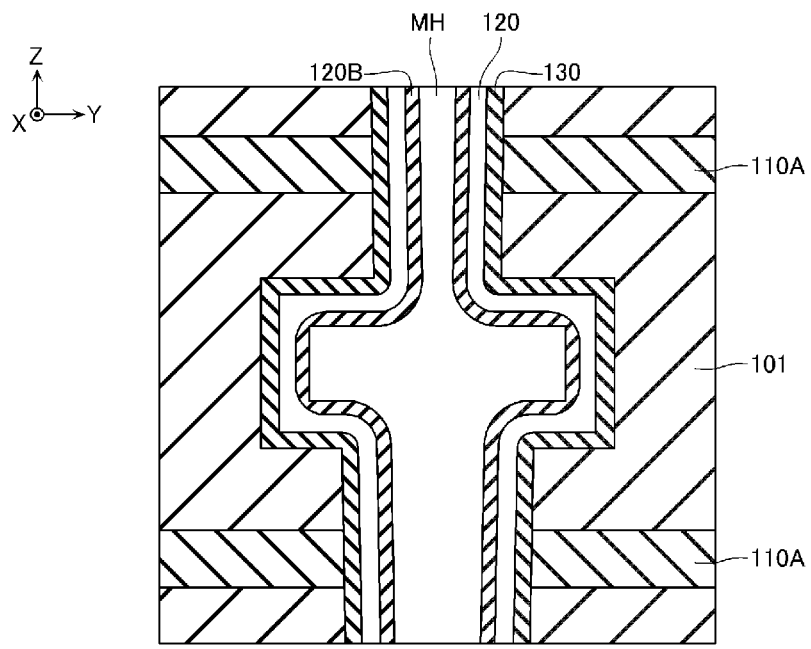
FIG. 20 is a schematic sectional view illustrating the same manufacturing method.
Figure 21:
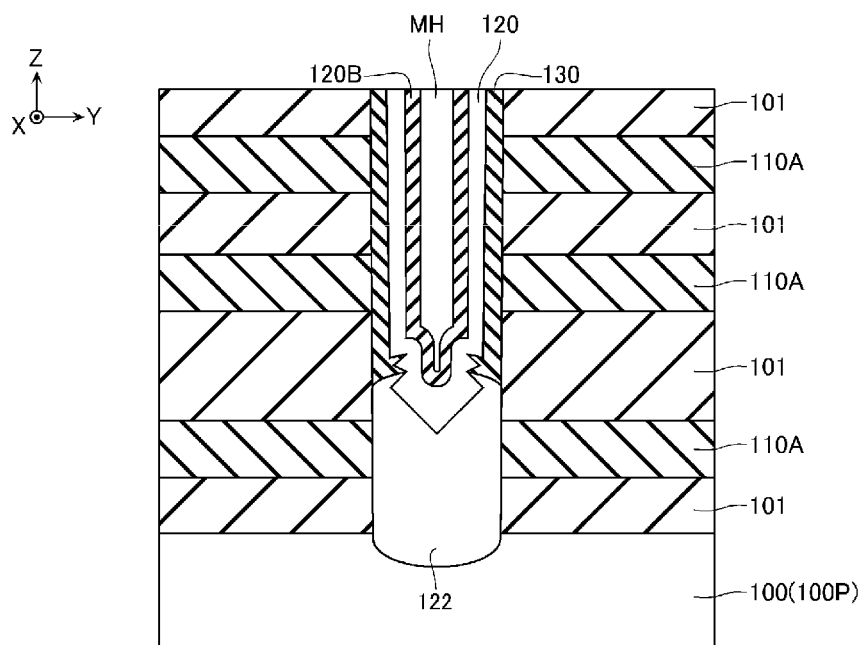
FIG. 21 is a schematic sectional view illustrating the same manufacturing method.
Figure 22:
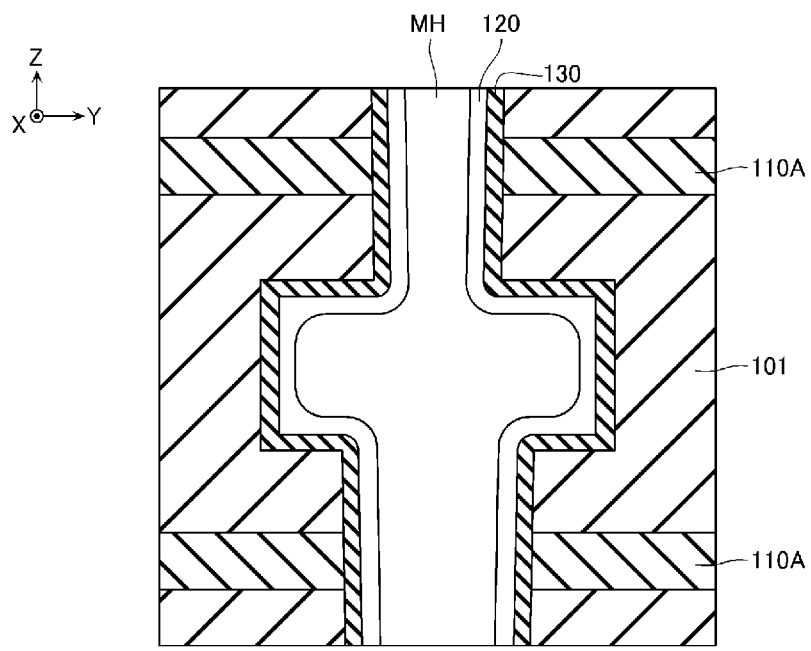
FIG. 22 is a schematic sectional view illustrating the same manufacturing method.
Figure 23:
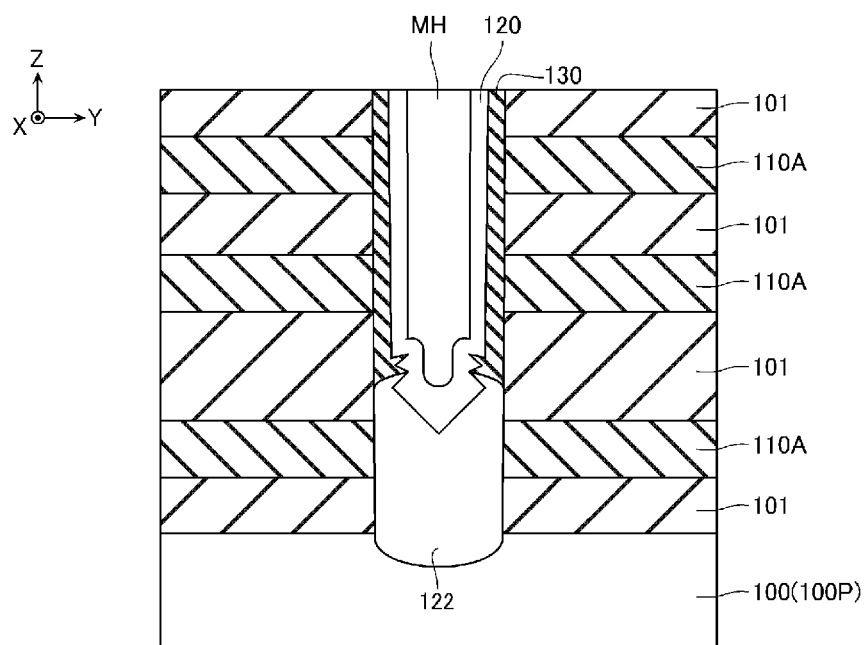
FIG. 23 is a schematic sectional view illustrating the same manufacturing method.

Next, the manufacturing method of the memory die MD will be described with reference to FIGS. 6 to 29. FIGS. 6 to 17 and FIGS. 24 to 29 are schematic sectional views illustrating the same manufacturing method, and illustrate cross-sections corresponding to the FIG. 2. FIGS. 18, 20 and 22 are schematic sectional views illustrating the same manufacturing method, and illustrate cross-sections corresponding to FIG. 4. FIGS. 19, 21, and 23 are schematic sectional views illustrating the same manufacturing method, and illustrate cross-sections corresponding to FIG. 5.

In manufacturing the memory die MD, first, a plurality of transistors constituting a peripheral circuit is formed in the peripheral circuit region $R_{PC}$ (FIG. 1) of the semiconductor substrate 100.

Figure 6:
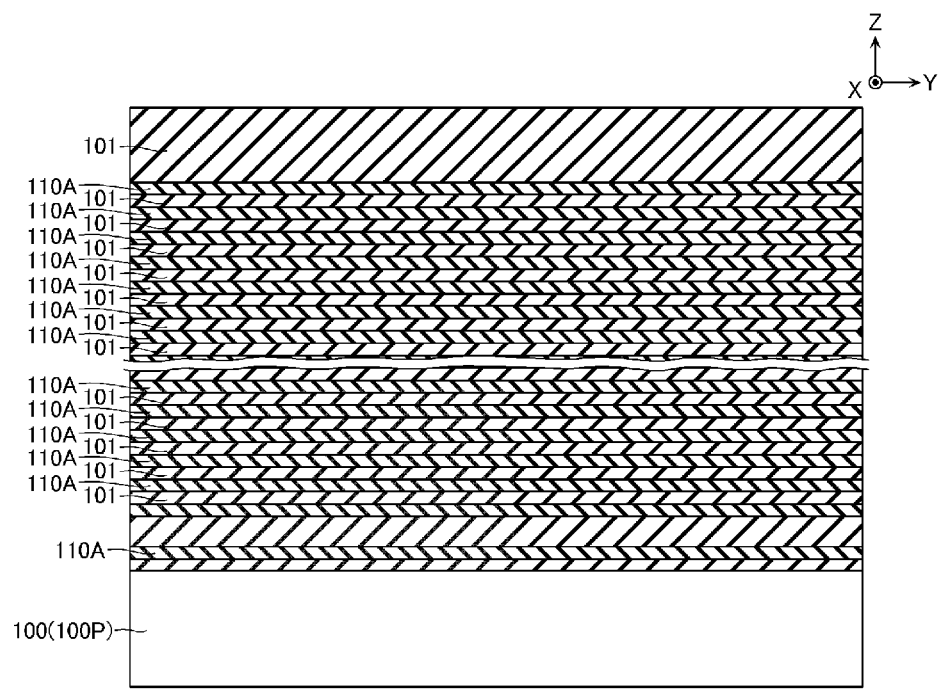
FIG. 6 is a schematic sectional view illustrating a manufacturing method of the memory die according to the first configuration example.

Next, for example, as illustrated in FIG. 6, a plurality of sacrifice layers 110A and the insulating layers 101 are formed on the semiconductor substrate 100. The sacrifice layer 110A is made of, for example, silicon nitride (SiN). This step is performed by, for example, a method such as chemical vapor deposition (CVD). The plurality of sacrifice layers 110A and the insulating layers 101 are formed in the memory cell array layer $L_{MCA1}$ of the memory cell array region $R_{MCA}$ described with reference to FIG. 1.

Figure 7:
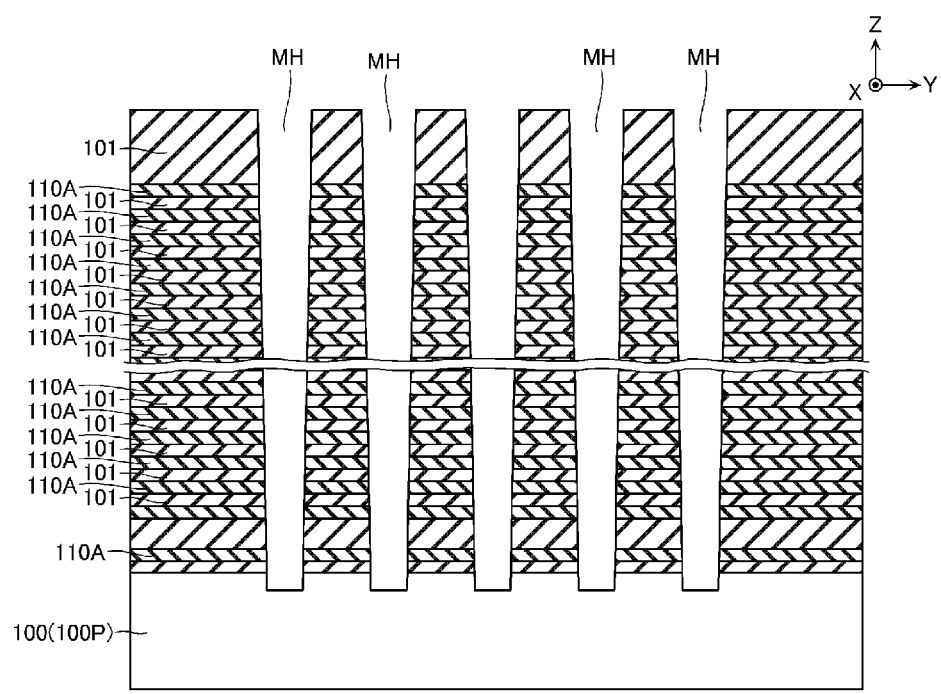
FIG. 7 is a schematic sectional view illustrating the same manufacturing method.

Next, for example, as illustrated in FIG. 7, a plurality of memory holes MH is formed at positions corresponding to the semiconductor layers 120 described with reference to FIG. 2. The memory hole MH is a through via hole that extends in the Z direction through the insulating layers 101 and the sacrifice layers 110A so that the upper surface of the semiconductor substrate 100 is exposed. This step is performed by, for example, a method such as RIE.

Figure 8:
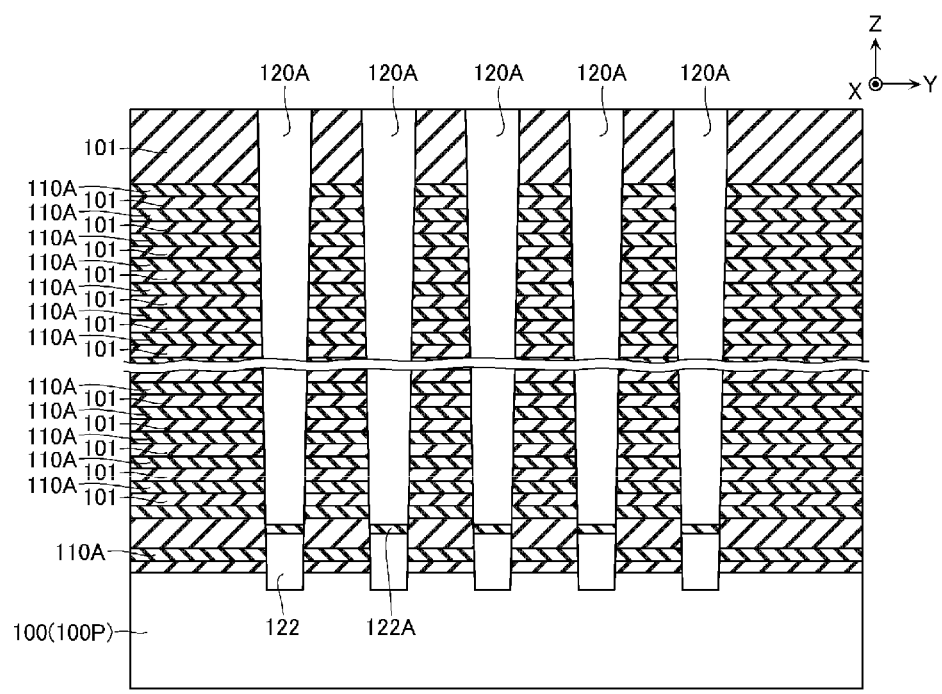
FIG. 8 is a schematic sectional view illustrating the same manufacturing method.

Next, for example, as illustrated in FIG. 8, the semiconductor layer 122 is formed on the bottom surface of the memory hole MH. This step is performed by, for example, a method such as epitaxial growth.

Next, for example, as illustrated in FIG. 8, an oxide film 122A is formed on the upper surface of the semiconductor layer 122. This step is performed by, for example, a method such as selective oxidation treatment.

Next, for example, as illustrated in FIG. 8, a sacrifice layer 120A is formed inside the memory hole MH. The sacrifice layer 120A is made of, for example, amorphous silicon. This step is performed by, for example, a method such as CVD.

Figure 9:
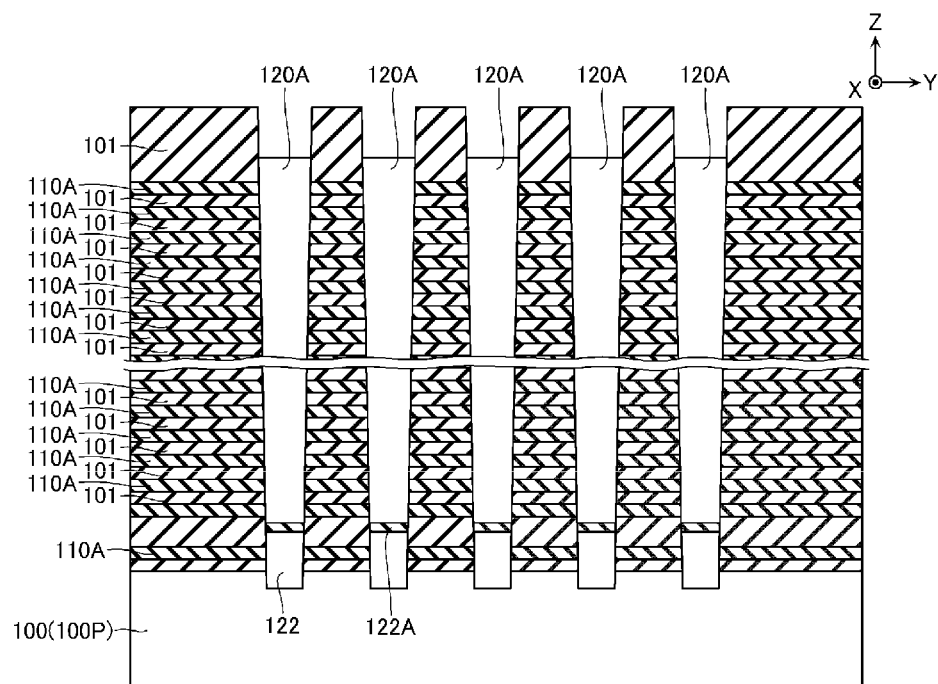
FIG. 9 is a schematic sectional view illustrating the same manufacturing method.

Next, for example, as illustrated in FIG. 9, the upper end portion of the sacrifice layer 120A is removed so that a part of the inner peripheral surface of the memory hole MH is exposed. This step is performed by, for example, a method such as RIE.

Figure 10:
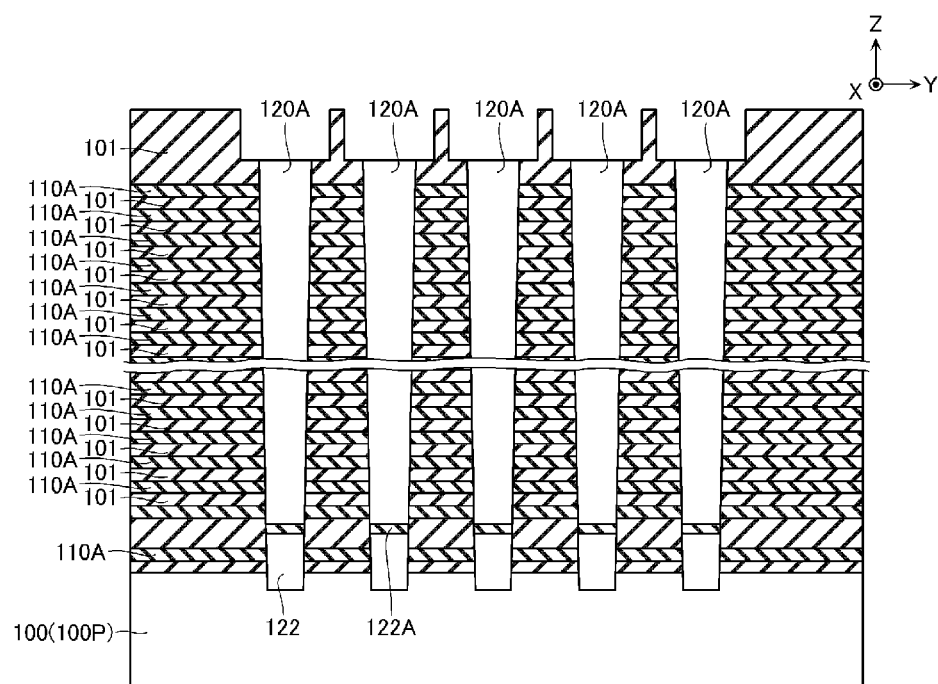
FIG. 10 is a schematic sectional view illustrating the same manufacturing method.

Next, for example, as illustrated in FIG. 10, a part of the insulating layer 101 is removed so as to widen the inner diameter of the upper end portion of the memory hole MH. This step is performed by, for example, a method such as wet etching.

Figure 11:
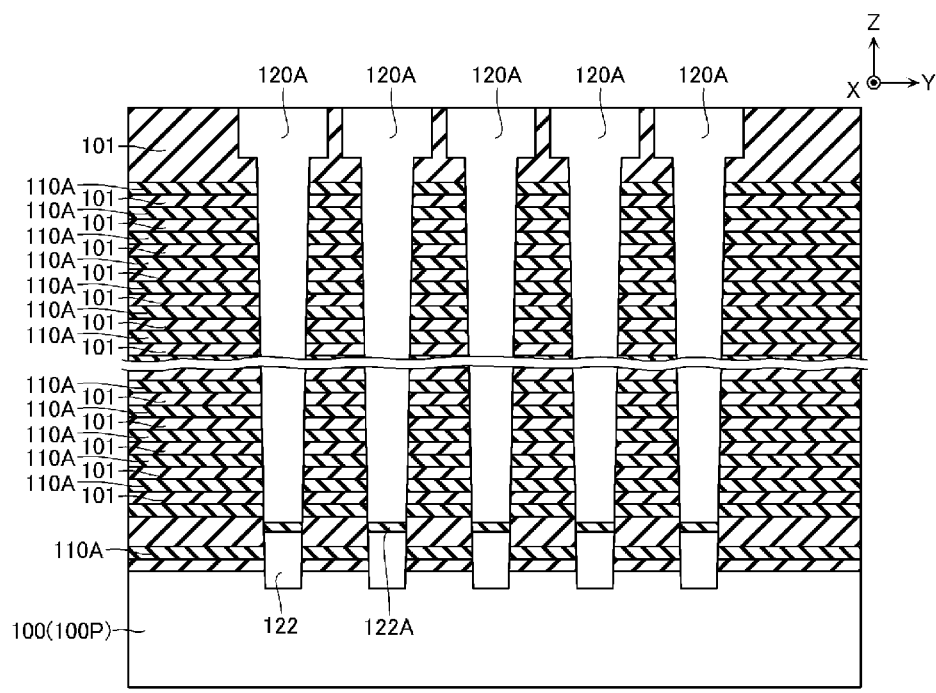
FIG. 11 is a schematic sectional view illustrating the same manufacturing method.

Next, for example, as illustrated in FIG. 11, the sacrifice layer 120A is formed inside the memory hole MH. This step is performed by, for example, a method such as CVD.

Figure 12:
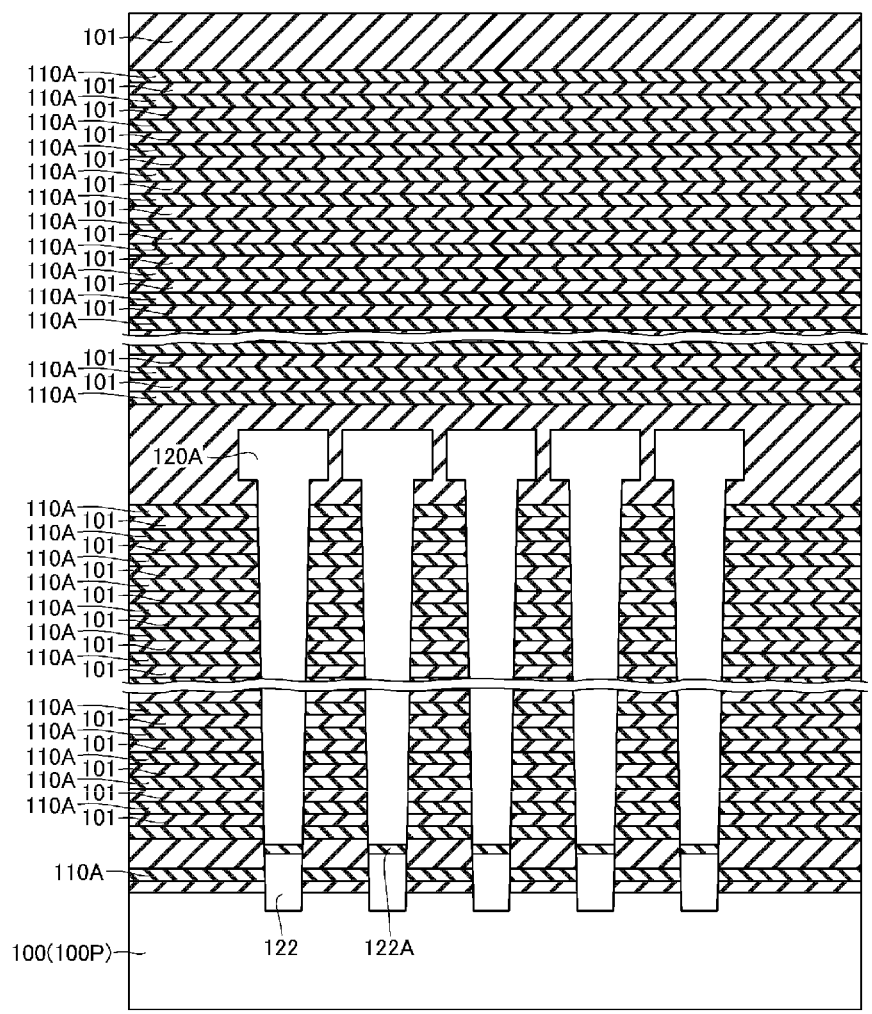
FIG. 12 is a schematic sectional view illustrating the same manufacturing method.

Next, for example, as illustrated in FIG. 12, the plurality of sacrifice layers 110A and the insulating layers 101 are formed on the upper surface of the structure illustrated in FIG. 11. This step is performed by, for example, a method such as CVD. The plurality of sacrifice layers 110A and the insulating layers 101 are formed in the memory cell array layer $L_{MCA2}$ of the memory cell array region $R_{MCA}$ described with reference to FIG. 1.

Figure 13:
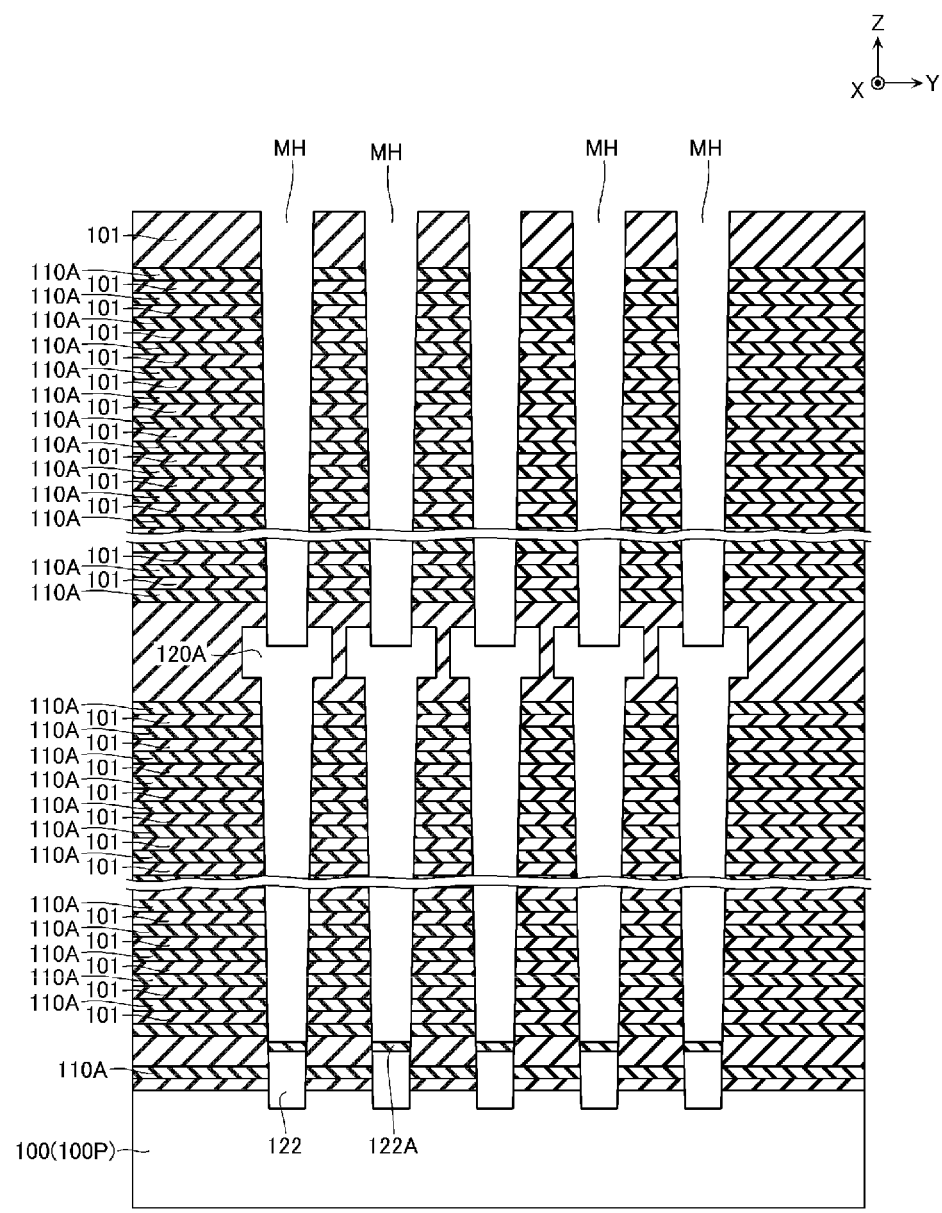
FIG. 13 is a schematic sectional view illustrating the same manufacturing method.

Next, for example, as illustrated in FIG. 13, the plurality of memory holes MH is formed at positions corresponding to the semiconductor layers 120 described with reference to FIG. 2. The memory hole MH is a through via hole that extends in the Z direction through the insulating layers 101 and the sacrifice layers 110A so that the upper surface of the sacrifice layer 120A is exposed. This step is performed by, for example, a method such as RIE.

Figure 14:
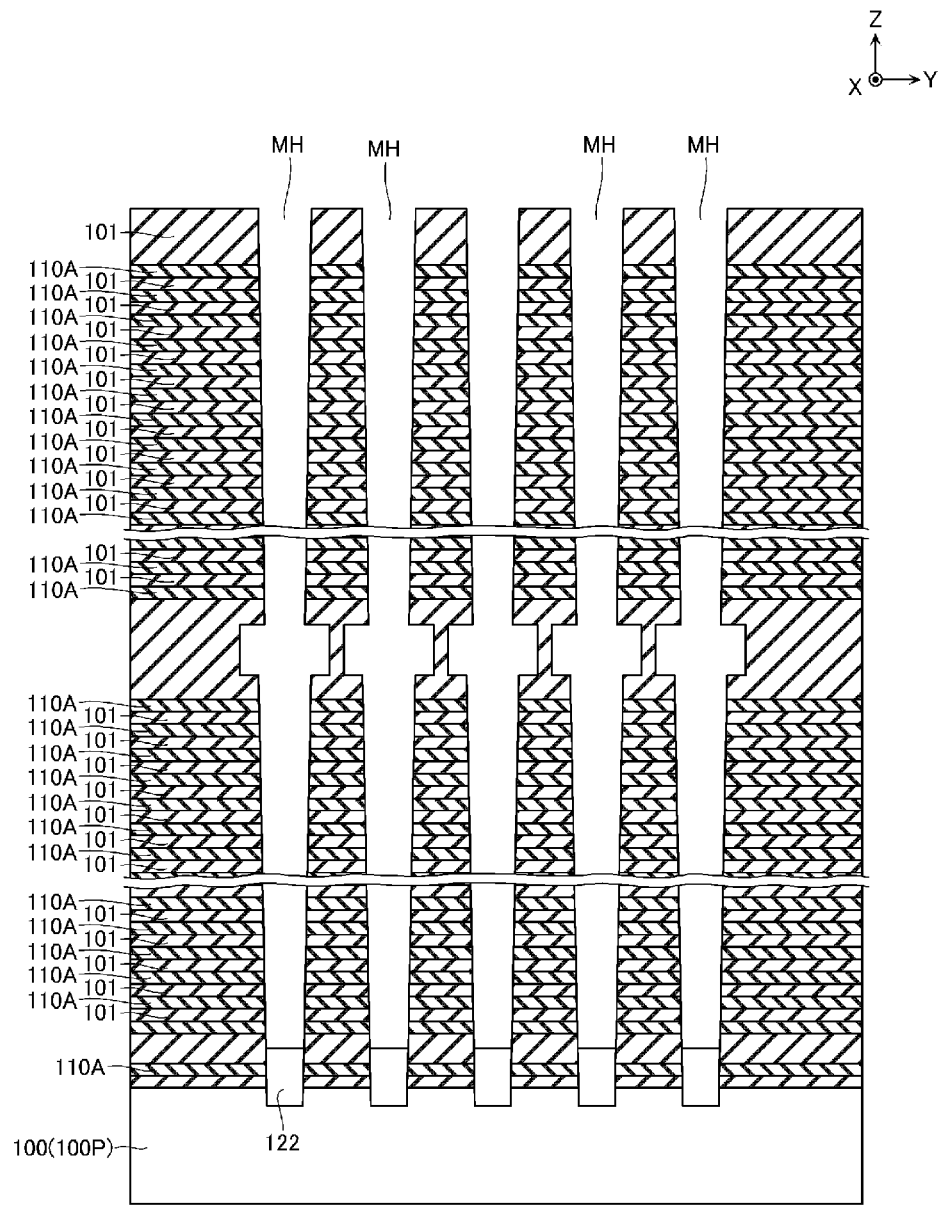
FIG. 14 is a schematic sectional view illustrating the same manufacturing method.

Next, for example, as illustrated in FIG. 14, the sacrifice layer 120A and the oxide film 122A formed within the memory hole MH are removed. This step is performed by, for example, a method such as wet etching and RIE. In this step, the oxide film 122A may not be removed.

Figure 15:
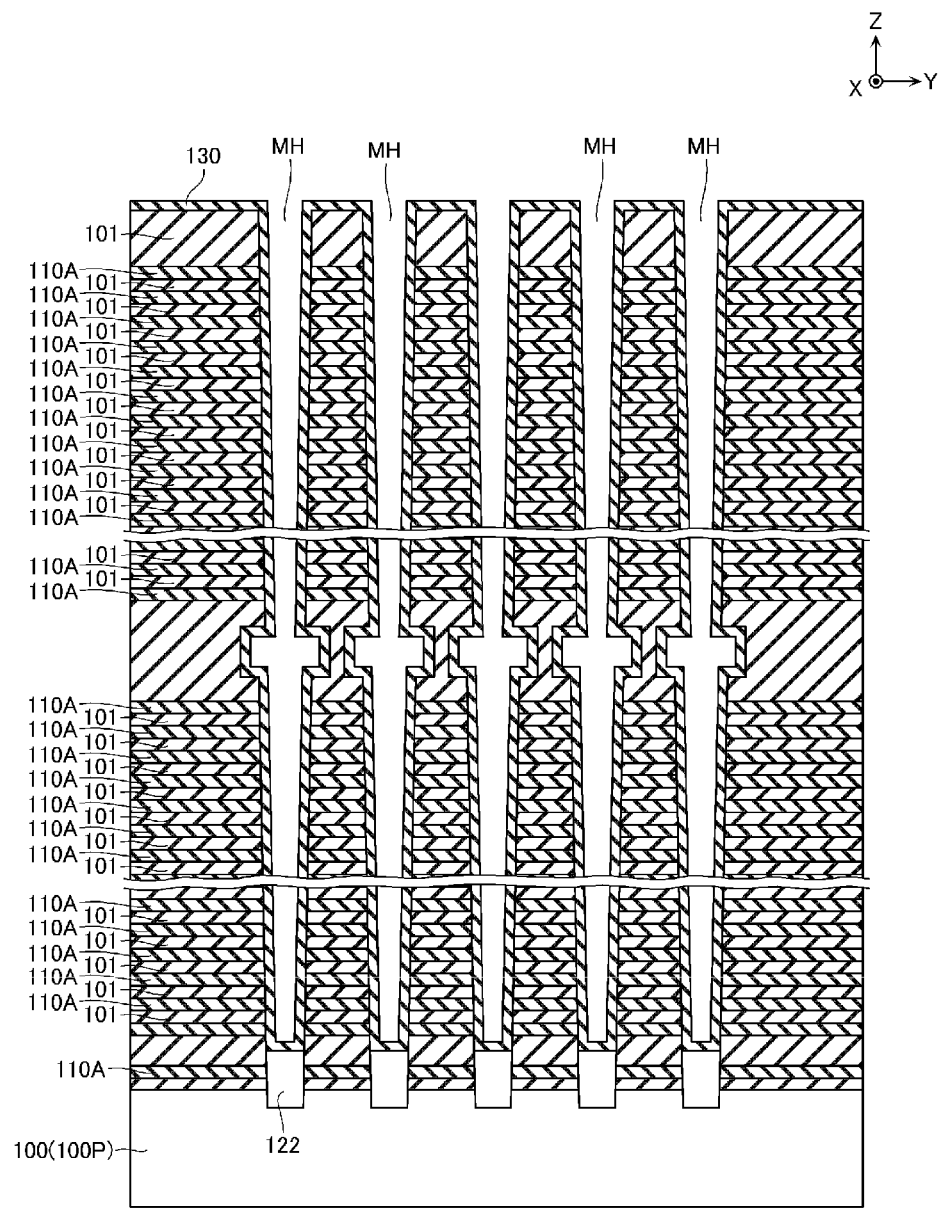
FIG. 15 is a schematic sectional view illustrating the same manufacturing method.

Next, for example, as illustrated in FIG. 15, the gate insulating film 130 is formed inside the memory hole MH. This step is performed by, for example, a method such as CVD.

Figure 16:
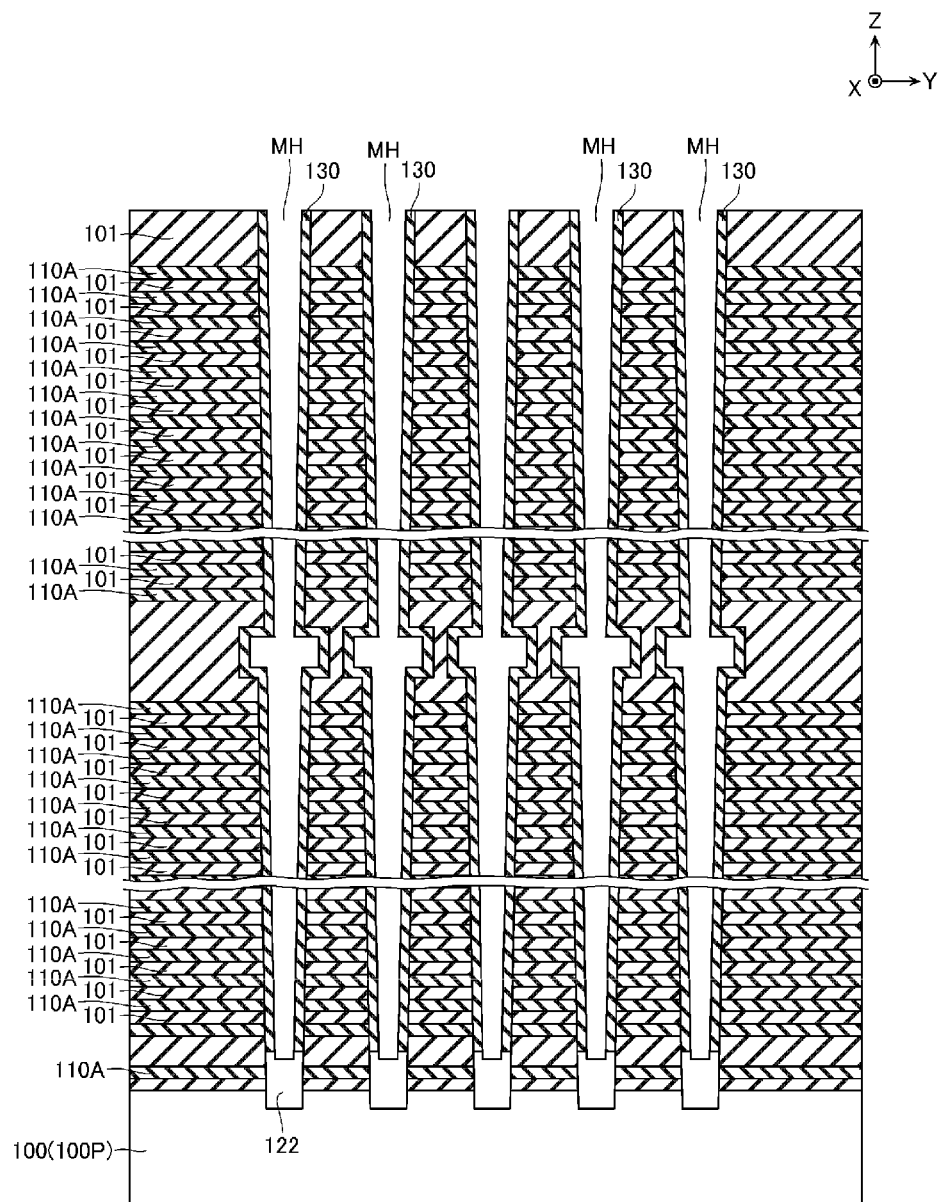
FIG. 16 is a schematic sectional view illustrating the same manufacturing method.

Next, for example, as illustrated in FIG. 16, a portion of the gate insulating film 130 that covers the upper surface of the insulating layer 101 and a portion that covers the upper surface of the semiconductor layer 122 are removed. This step is performed by, for example, a method such as RIE.

Figure 17:
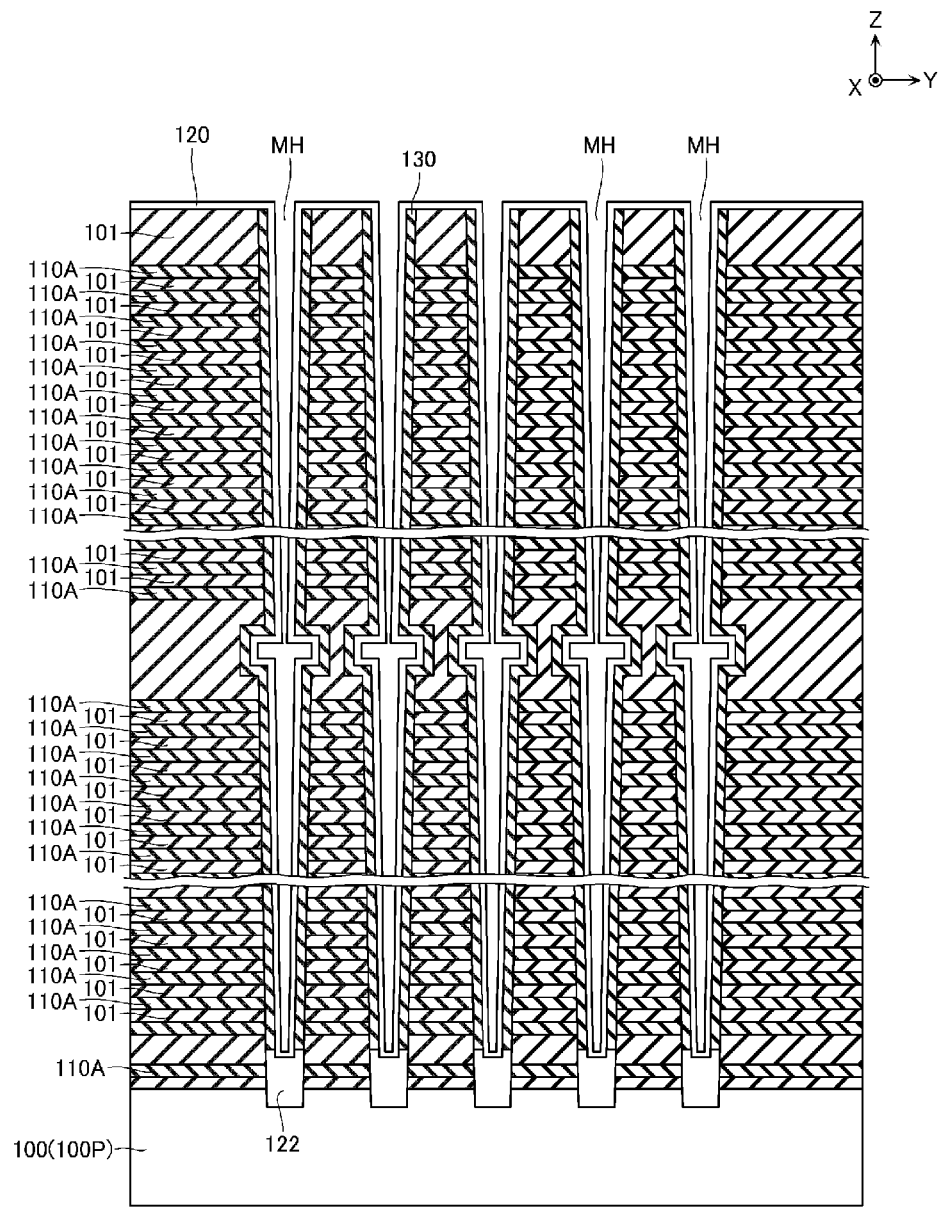
FIG. 17 is a schematic sectional view illustrating the same manufacturing method.
Figure 18:
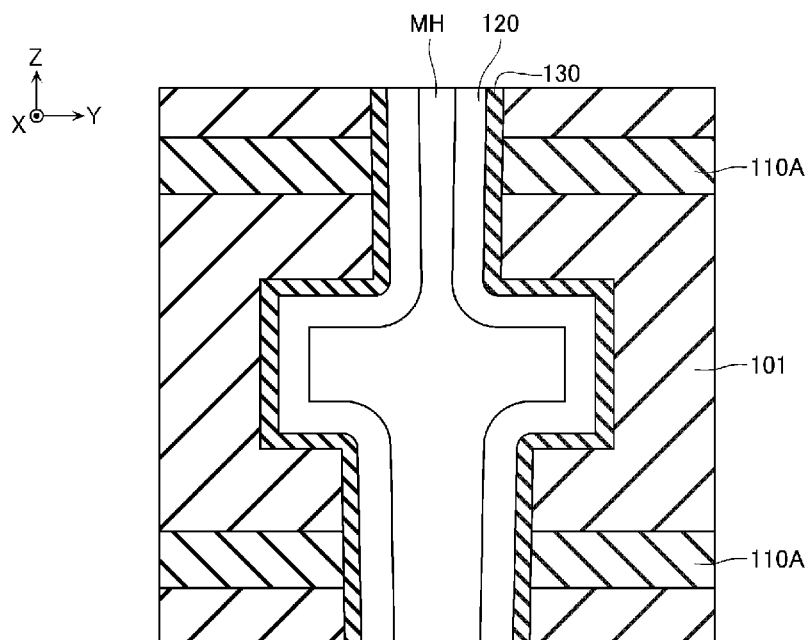
FIG. 18 is a schematic sectional view illustrating the same manufacturing method.
Figure 19:
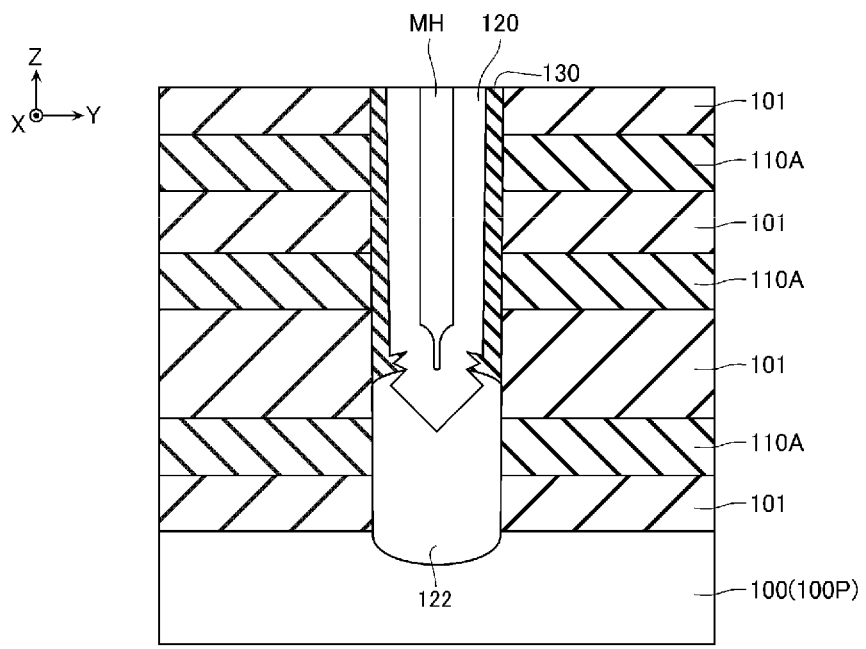
FIG. 19 is a schematic sectional view illustrating the same manufacturing method.

Next, for example, as illustrated in FIGS. 17 to 19, the semiconductor layer 120 is formed on the upper surface of the semiconductor layer 122 and the inner peripheral surface of the gate insulating film 130. In this step, for example, a semiconductor layer of amorphous silicon is formed on the upper surface of the semiconductor layer 122 and the inner peripheral surface of the gate insulating film 130 by a method such as CVD. Then, the crystal structure of this semiconductor layer is modified by annealing treatment so as to form the semiconductor layer 120 of polycrystalline silicon.

Next, for example, as illustrated in FIGS. 20 and 21, a part of the semiconductor layer 120 is oxidized to form an oxide film 120B. This step is performed by, for example, oxidation treatment.

Next, for example, as illustrated in FIGS. 22 and 23, the oxide film 120B is selectively removed. This step is performed by, for example, wet etching. This step is performed under, for example, a condition where the etching rate of the oxide film 120B is sufficiently smaller than the etching rate of the semiconductor layer 120.

Figure 24:
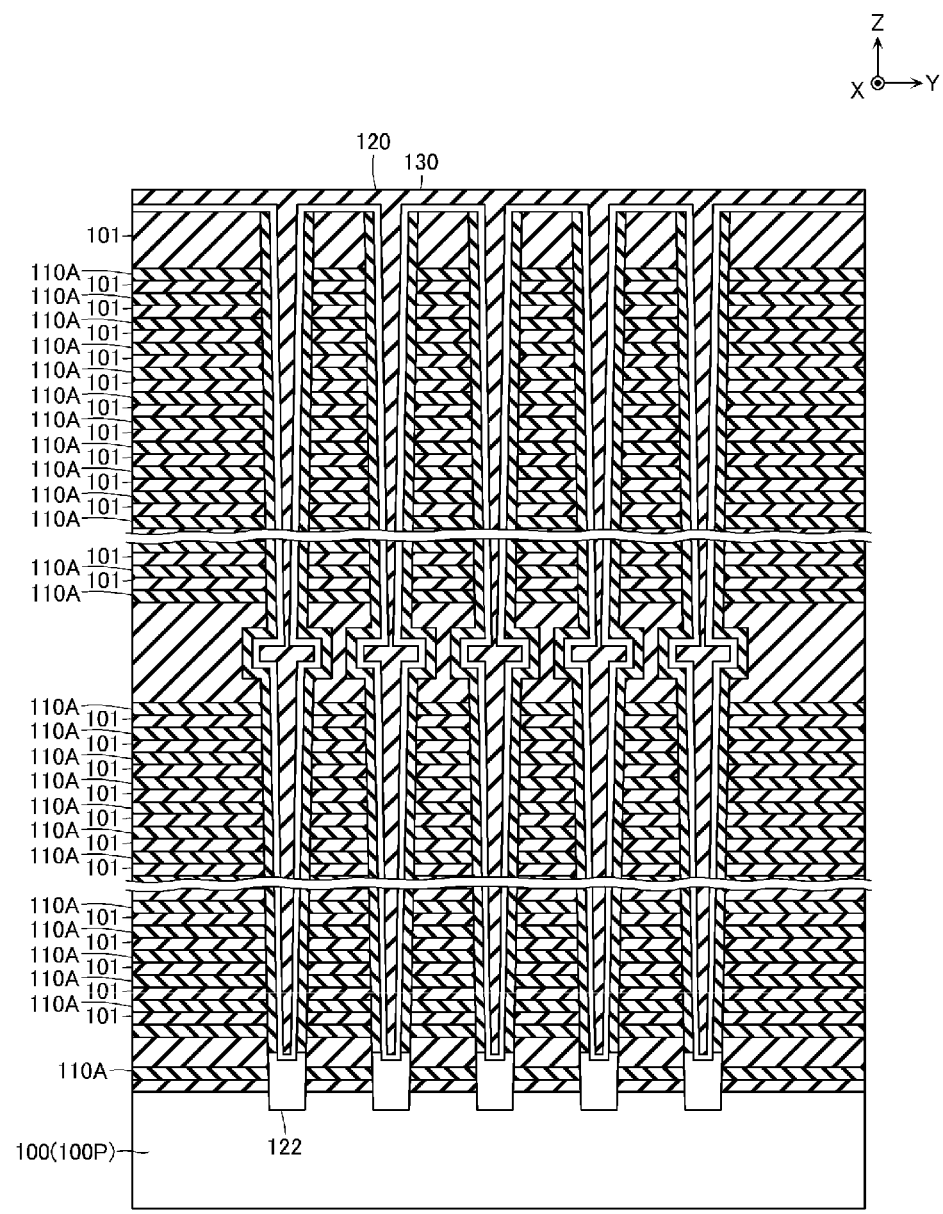
FIG. 24 is a schematic sectional view illustrating the same manufacturing method.

Next, for example, as illustrated in FIG. 24, the insulating layer 125 is formed inside the memory hole MH. This step is performed by, for example, a method such as CVD.

Figure 25:
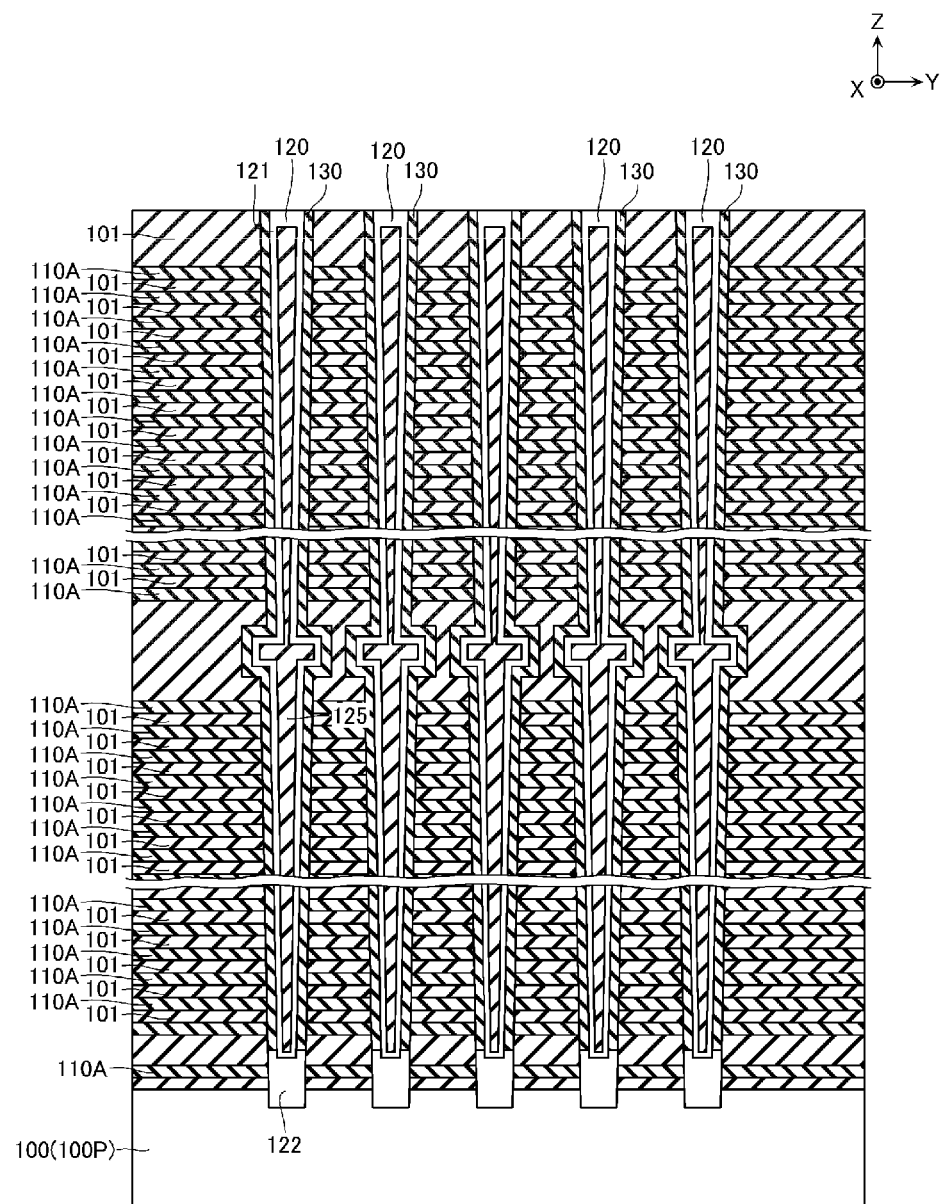
FIG. 25 is a schematic sectional view illustrating the same manufacturing method.

Next, for example, as illustrated in FIG. 25, the impurity region 121 is formed on the upper end portion of the semiconductor layer 120. This step is performed by, for example, a method such as RIE or CVD.

Figure 26:
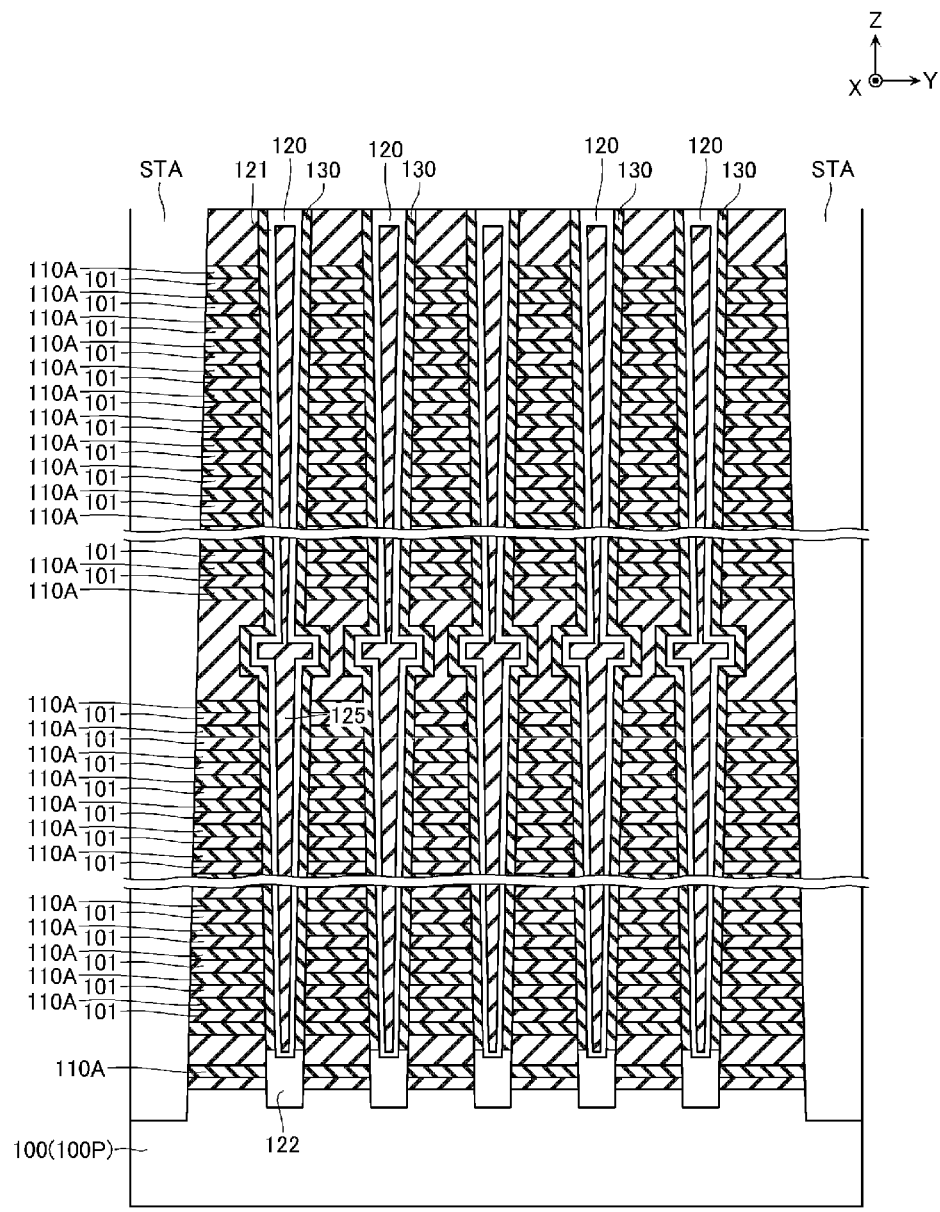
FIG. 26 is a schematic sectional view illustrating the same manufacturing method.

Next, for example, as illustrated in FIG. 26, a groove STA is formed. The groove STA is a groove that extends in the Z direction and the X direction and divides the insulating layers 101 and the sacrifice layers 110A in the Y direction so that the upper surface of the semiconductor substrate 100 is exposed. This step is performed by, for example, a method such as RIE.

Figure 27:
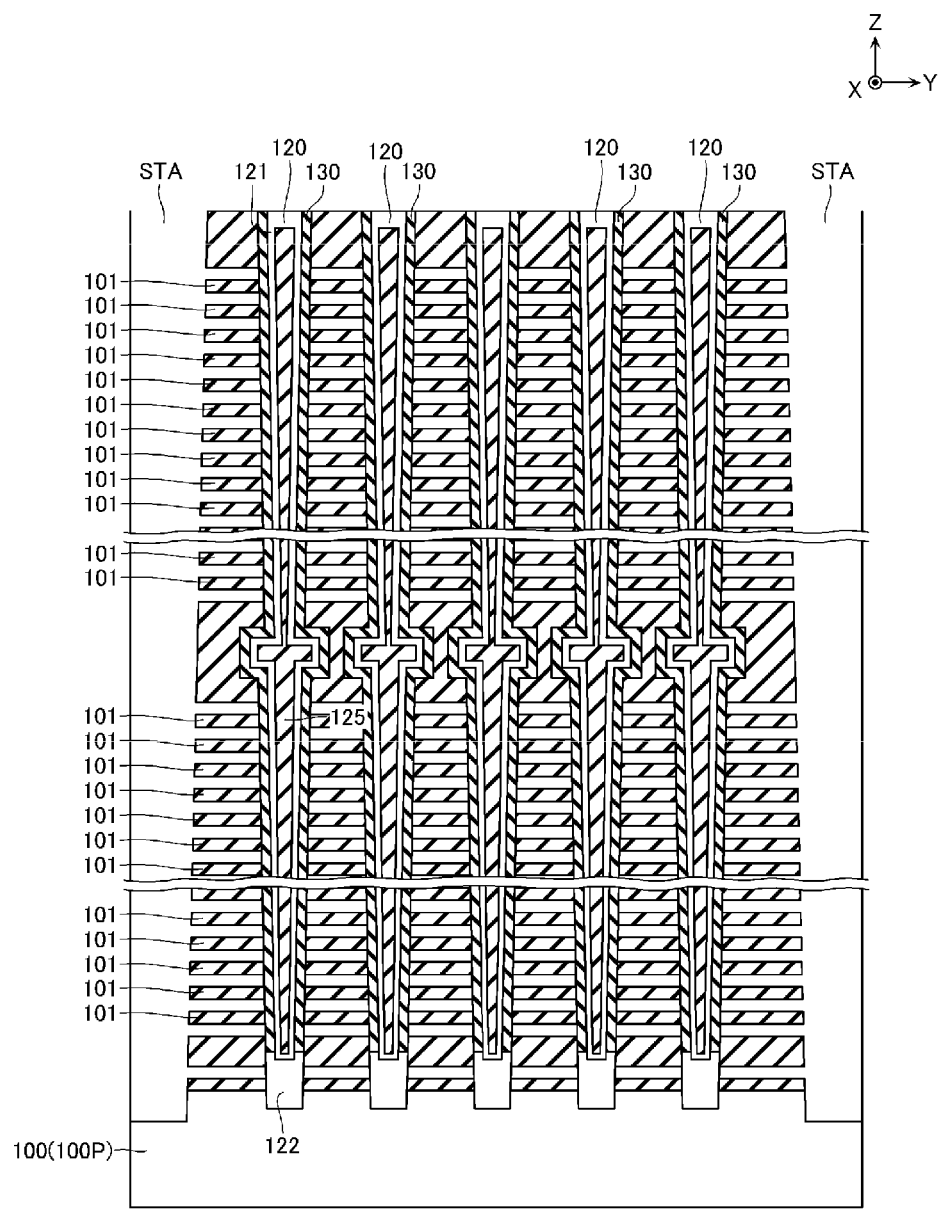
FIG. 27 is a schematic sectional view illustrating the same manufacturing method.

Next, for example, as illustrated in FIG. 27, the sacrifice layers 110A are removed through the groove STA. Accordingly, a hollow structure that includes the plurality of insulating layers 101 arranged in the Z direction, and the structure within the memory hole MH supporting the insulating layers 101 (the semiconductor layer 120, the gate insulating film 130 and the insulating layer 125) is formed. This step is performed by, for example, a method such as wet etching.

Figure 28:
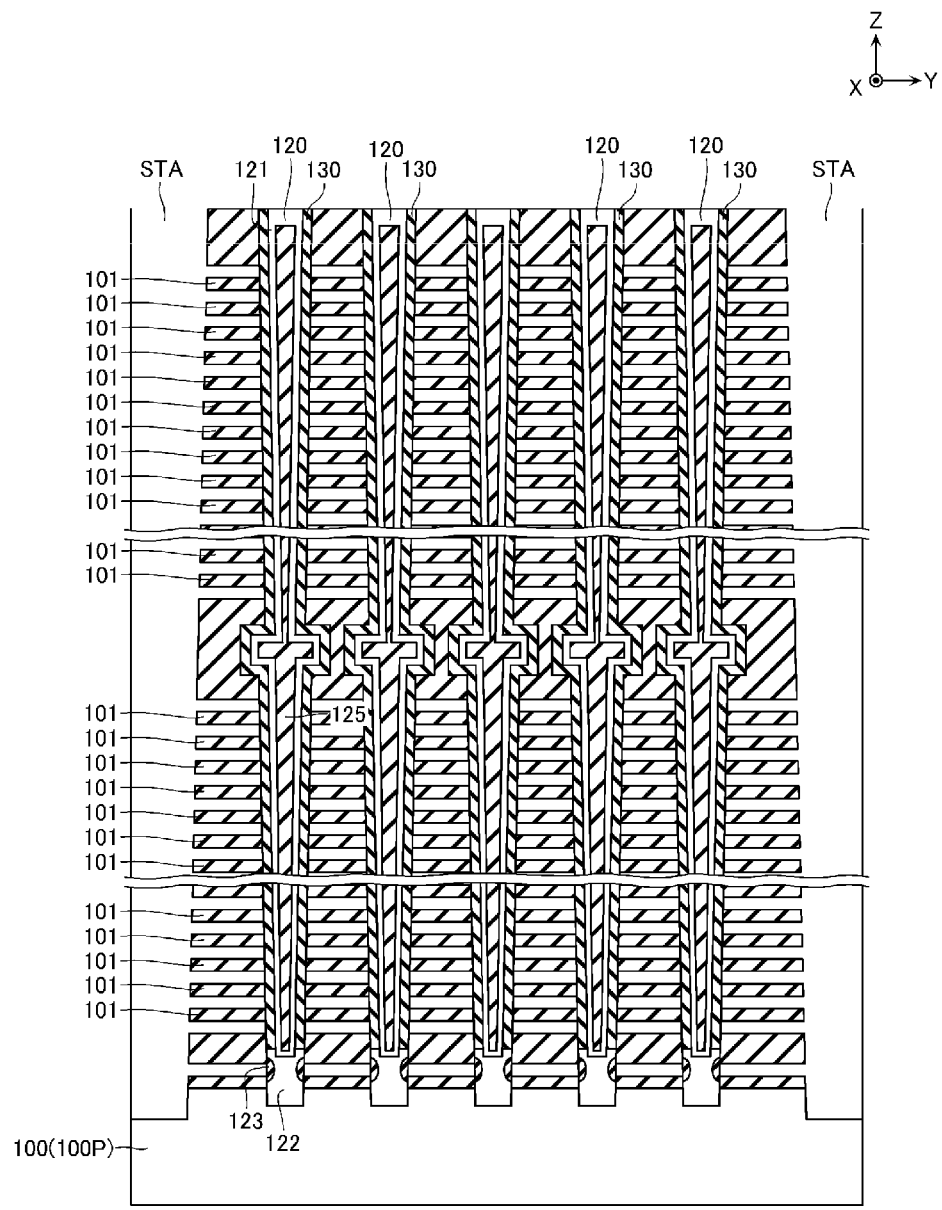
FIG. 28 is a schematic sectional view illustrating the same manufacturing method.

Next, for example, as illustrated in FIG. 28, the insulating layer 123 is formed. This step is performed by, for example, a method such as oxidation treatment.

Figure 29:
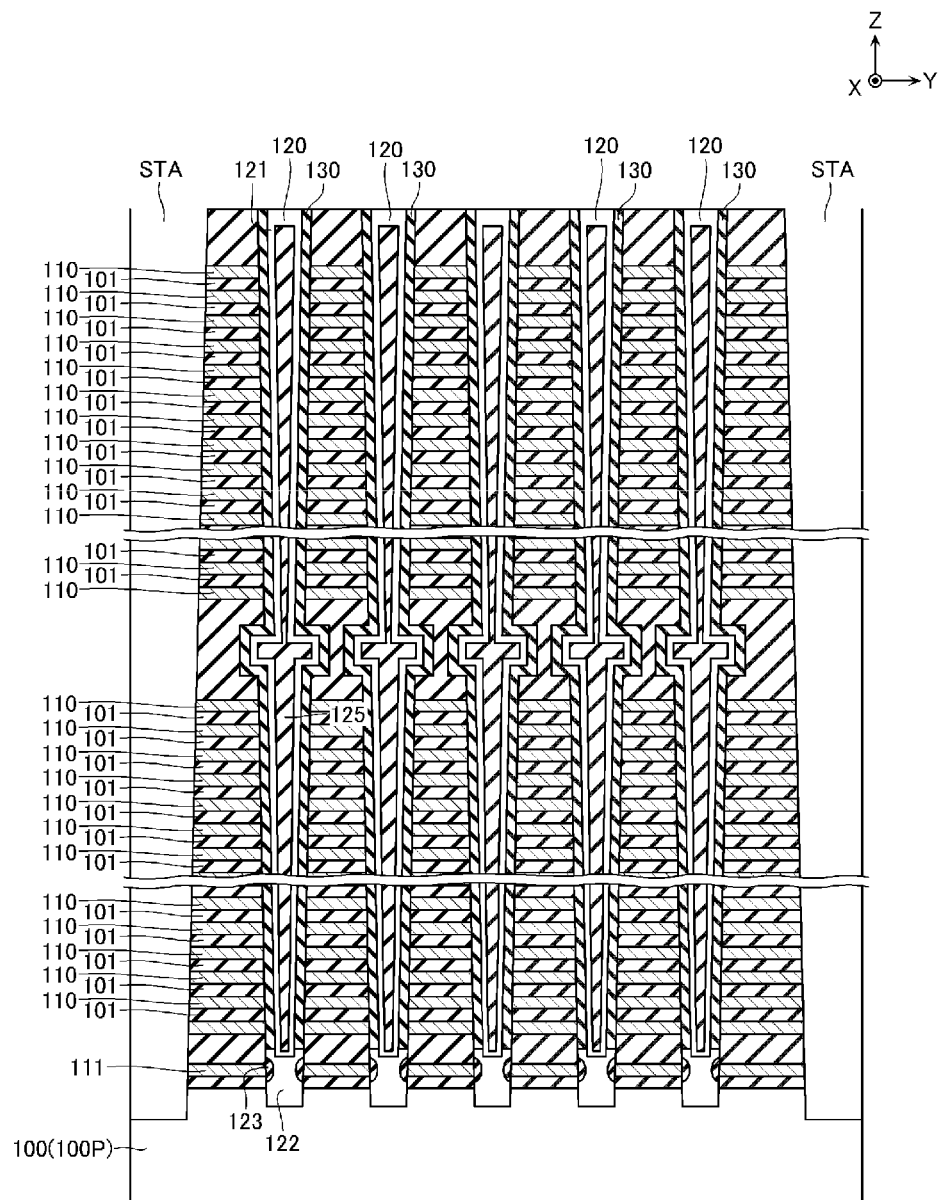
FIG. 29 is a schematic sectional view illustrating the same manufacturing method.

Next, for example, as illustrated in FIG. 29, the conductive layers 110 are formed. This step is performed by, for example, a method such as CVD.

Then, the contact structure ST (FIG. 2) is formed in the groove STA, and wiring (not illustrated) is formed so that the memory die MD is formed.

Second Configuration Example

Figure 30:
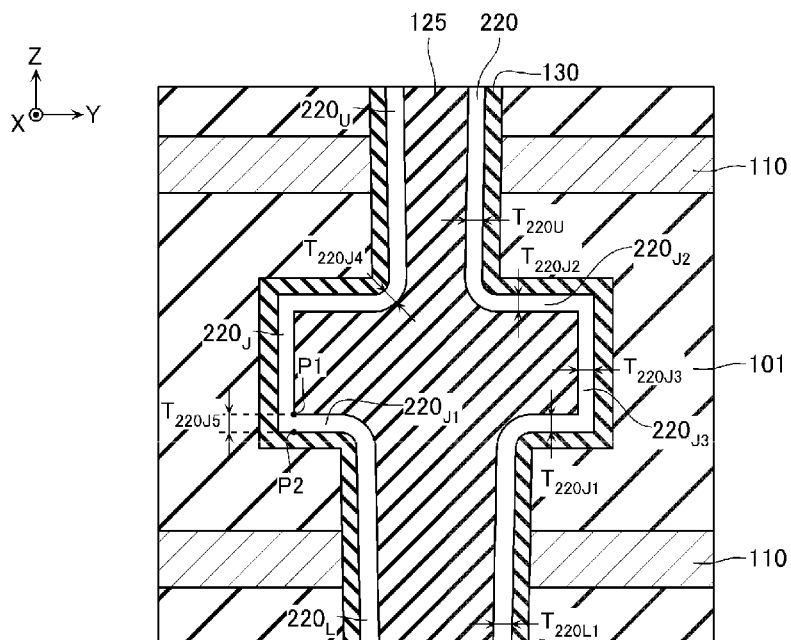
FIG. 30 is a schematic sectional view of a memory die according to a second configuration example.
Figure 31:
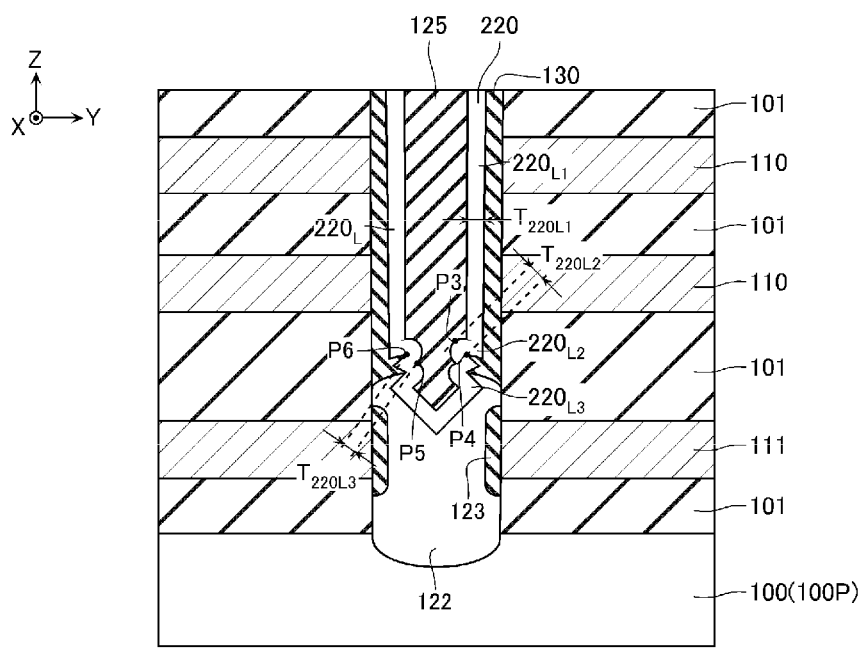
FIG. 31 is a schematic sectional view of the memory die according to the second configuration example.

FIGS. 30 and 31 are schematic sectional views illustrating a part of the configuration of a memory die according to a second configuration example. Unlike the memory die MD according to the first configuration example, the memory die according to the second configuration example does not include the semiconductor layer 120. Instead, the memory die according to the second configuration example includes a semiconductor layer 220.

The semiconductor layer 220 includes a region $220_L$ in the memory cell array layer $L_{MCA1}$, and a region $220_U$ in the memory cell array layer $L_{MCA2}$. The semiconductor layer 220 includes a region $220_J$ provided between the upper end of the region $220_L$ and the lower end of the region $220_U$.

In the example of FIG. 30, the thickness of the semiconductor layer 220 in the region $220_L$ is indicated by $T_{220L1}$. The thickness of the semiconductor layer 220 in the region $220_U$ is indicated by $T_{220U}$.

In the illustrated example, the region $220_J$ of the semiconductor layer 220 includes a substantially linear region $220_{J1}$ extending radially outward from the upper end of the region $220_L$, a substantially linear region $220_{J2}$ extending radially outward from the lower end of the region $220_U$, and a substantially linear region $220_{J3}$ that is provided between these regions $220_{J1}$ and $220_{J2}$ and extends in the Z direction. In the drawing, the thicknesses of the semiconductor layer 220 in these regions $220_{J1}$, $220_{J2}$, and $220_{J3}$ are indicated by $T_{220J1}$, $T_{220J2}$ and $T_{220J3}$, respectively.

In the illustrated example, the thickness of the semiconductor layer 220 in a portion provided between the region $220_J$ and the region $220_L$, and the thickness in a portion provided between the region $220_J$ and the region $220_U$ are indicated by $T_{220J4}$.

In the illustrated example, the thickness of the semiconductor layer 220 in a portion provided between the region $220_{J1}$ and the region $220_{J3}$, and the thickness in a portion provided between the region $220_{J2}$ and the region $220_{J3}$ are indicated by $T_{220J5}$. In the illustrated example, a point P1 is set on the inside surface of the semiconductor layer 220 (on the side of the insulating layer 125), and a point P2 is set for a point at which a distance to the point P1 is minimized on the outside surface of the semiconductor layer 220 (on the side of the conductive layer 110 and the insulating layer 101), so that the distance between the point P1 and the point P2 is set as the thickness $T_{220J5}$.

As illustrated in FIG. 30, the thickness $T_{220J5}$ in the second configuration example is substantially the same as the above described thicknesses $T_{220L1}$, $T_{220U}$, $T_{220J1}$, $T_{220J2}$, $T_{220J3}$, and $T_{220J4}$.

In the example of FIG. 31, the region $220_L$ of the semiconductor layer 220 includes a region $220_{L1}$ that is provided between the plurality of conductive layers 110 and the insulating layer 125 and extends in the Z direction, a region $220_{L2}$ extending radially inward from the lower end of the region $220_{L1}$, and a region $220_{L3}$ that extends downward from the end of the radial inside of the region $220_{L2}$ and is connected to the upper surface of the semiconductor layer 122. The thickness of the semiconductor layer 220 in the region $220_{L1}$ is $T_{220L1}$ as described with reference to FIG. 30.

In the illustrated example, the thickness of the semiconductor layer 220 in a portion provided between the region $220_{L2}$ and the region $220_{L3}$ is indicated by $T_{220L2}$. In the illustrated example, a point P3 is set on the inside surface of the semiconductor layer 220 (on the side of the insulating layer 125), and a point P4 is set for a point at which a distance to the point P3 is minimized on the outside surface of the semiconductor layer 220 (on the side of the conductive layer 110 and the insulating layer 101), so that the distance between the point P3 and the point P4 is set as the thickness $T_{220L2}$.

In the illustrated example, the thickness of the semiconductor layer 220 in the region $220_L$, at a predetermined position within the region $220_{L3}$, is indicated by $T_{220L3}$. In the illustrated example, a point P5 is set on the inside surface of the semiconductor layer 220 (on the side of the insulating layer 125), and a point P6 is set for a point at which a distance to the point P5 is minimized on the outside surface of the semiconductor layer 220 (on the side of the conductive layer 110 and the insulating layer 101), so that the distance between the point P5 and the point P6 is set as the thickness $T_{220L3}$.

As illustrated in FIG. 31, the thickness $T_{220L3}$ in the second configuration example is substantially the same as the above described thicknesses $T_{220L1}$ and $T_{220L2}$.

Next, the manufacturing method of the memory die according to the second configuration example will be described. The memory die according to the second configuration example can be basically manufactured in the same manner as the memory die MD according to the first configuration example. Meanwhile, when the memory die according to the second configuration example is manufactured, the steps described with reference to FIGS. 20 to 23 are not performed.

Third Configuration Example

Figure 32:
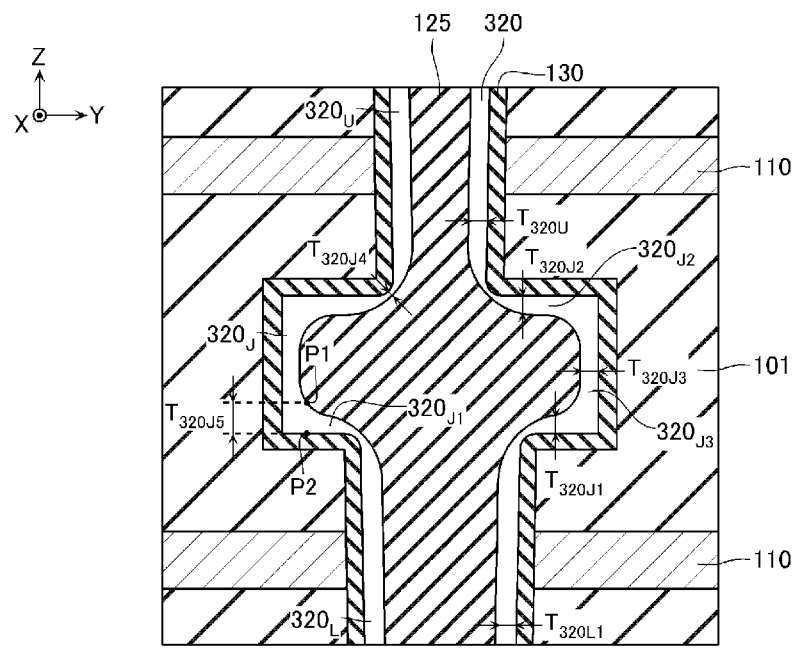
FIG. 32 is a schematic sectional view of a memory die according to a third configuration example.
Figure 33:
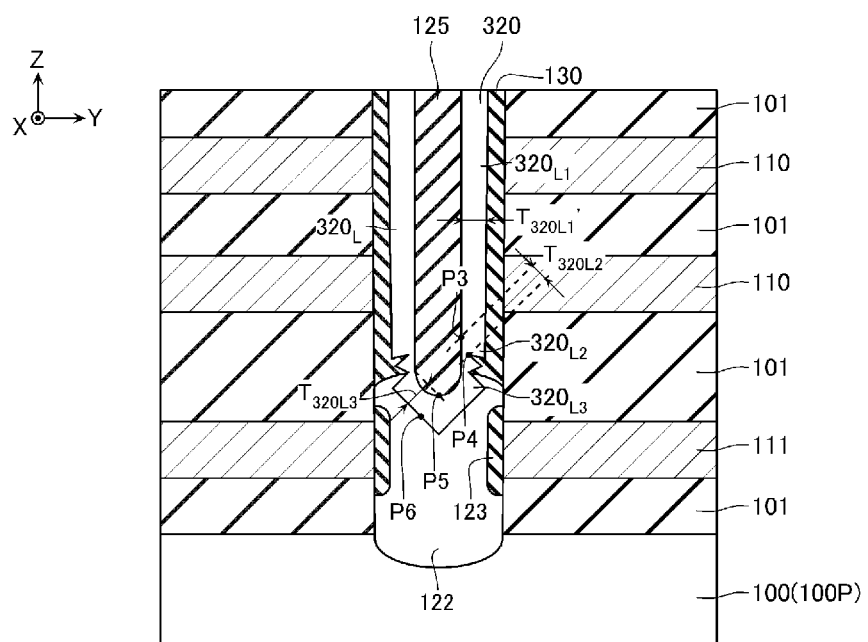
FIG. 33 is a schematic sectional view of the memory die according to the third configuration example.

FIGS. 32 and 33 are schematic sectional views illustrating a part of the configuration of a memory die according to a third configuration example. Unlike the memory die MD according to the first configuration example, the memory die according to the third configuration example does not include the semiconductor layer 120. Instead, the memory die according to the third configuration example includes a semiconductor layer 320.

The semiconductor layer 320 includes a region $320_L$ in the memory cell array layer $L_{MCA1}$, and a region $320_U$ in the memory cell array layer $L_{MCA2}$. The semiconductor layer 320 includes a region $320_J$ provided between the upper end of the region $320_L$ and the region $320_U$.

In the example of FIG. 32, the thickness of the semiconductor layer 320 in the region $320_L$ is indicated by $T_{320L1}$. The thickness of the semiconductor layer 320 in the region $320_U$ is indicated by $T_{320U}$.

In the illustrated example, the region $320_J$ of the semiconductor layer 320 includes a region $320_{J1}$ extending radially outward from the upper end of the region $320_L$, a region $320_{J2}$ extending radially outward from the lower end of the region $320_U$, and a substantially linear region $320_{J3}$ that is provided between these regions $320_{J1}$, and $320_{J2}$ and extends in the Z direction. In the drawing, the thicknesses of the semiconductor layer 320 in these regions $320_{J1}$, $320_{J2}$, and $320_{J3}$ are indicated by $T_{320J1}$, $T_{320J2}$, and $T_{320J3}$, respectively.

In the illustrated example, the thicknesses of the semiconductor layer 320 in a portion provided between the region $320_J$ and the region $320_L$, and in a portion provided between the region $320_J$ and the region $320_U$ are indicated by $T_{320J4}$.

In the illustrated example, the thickness of the semiconductor layer 320 in a portion provided between the region $320_{J1}$ and the region $320_{J3}$, and the thickness in a portion provided between the region $320_{J2}$ and the region $320_{J3}$ are indicated by $T_{320J5}$. In the illustrated example, a point P1 is set on the inside surface of the semiconductor layer 320 (on the side of the insulating layer 125), and a point P2 is set for a point at which a distance to the point P1 is minimized on the outside surface of the semiconductor layer 320 (on the side of the conductive layer 110 and the insulating layer 101), so that the distance between the point P1 and the point P2 is set as the thickness $T_{320J5}$.

As illustrated in FIG. 32, the thickness $T_{320J4}$ in the third configuration example is smaller than the above described thicknesses $T_{320L1}$, $T_{320U}$, $T_{320J1}$, $T_{320J2}$, and $T_{320J3}$. A difference between the thickness $T_{320J4}$ and the thicknesses $T_{320L1}$, $T_{320U}$, $T_{320J1}$, $T_{320J2}$, and $T_{320J3}$ is larger than 2 nm.

In the example of FIG. 33, the region $320_L$ of the semiconductor layer 320 includes a region $320_{L1}$ that is provided between the plurality of conductive layers 110 and the insulating layer 125 and extends in the Z direction, a region $320_{L2}$ extending radially inward from the lower end of the region $320_{L1}$, and a region $320_{L3}$ that extends downward from the end of the radial inside of the region $320_{L2}$ and is connected to the upper surface of the semiconductor layer 122. The thickness of the semiconductor layer 320 in the region $320_{L1}$, in the lower end of the region $320_{L1}$, is a thickness $T_{320L1}'$ that is larger than the thickness $T_{320L1}$ in the vicinity of the upper end.

In the illustrated example, the thickness of the semiconductor layer 320 in a portion provided between the region $320_{L2}$ and the region $320_{L3}$ is indicated by $T_{320L2}$. In the illustrated example, a point P3 is set on the inside surface of the semiconductor layer 320 (on the side of the insulating layer 125), and a point P4 is set for a point at which a distance to the point P3 is minimized on the outside surface of the semiconductor layer 320 (on the side of the conductive layer 110 and the insulating layer 101), so that the distance between the point P3 and the point P4 is set as the thickness $T_{320L2}$.

In the illustrated example, the thickness of the semiconductor layer 320, at a predetermined position within the region $320_{L3}$, is indicated by $T_{320L3}$. In the illustrated example, a point P5 is set on the inside surface of the semiconductor layer 320 (on the side of the insulating layer 125), and a point P6 is set for a point at which a distance to the point P5 is minimized on the outside surface of the semiconductor layer 320 (on the side of the conductive layer 110 and the insulating layer 101), so that the distance between the point P5 and the point P6 is set as the thickness $T_{320L3}$.

As illustrated in FIG. 33, the thickness $T_{320L2}$ in the third configuration example is smaller than the above described thicknesses $T_{320L1}'$ and $T_{320L3}$. A difference between the thickness $T_{320L2}$, and the thicknesses $T_{320L1}'$ and $T_{320L3}$ is larger than 2 nm.

Figure 34:
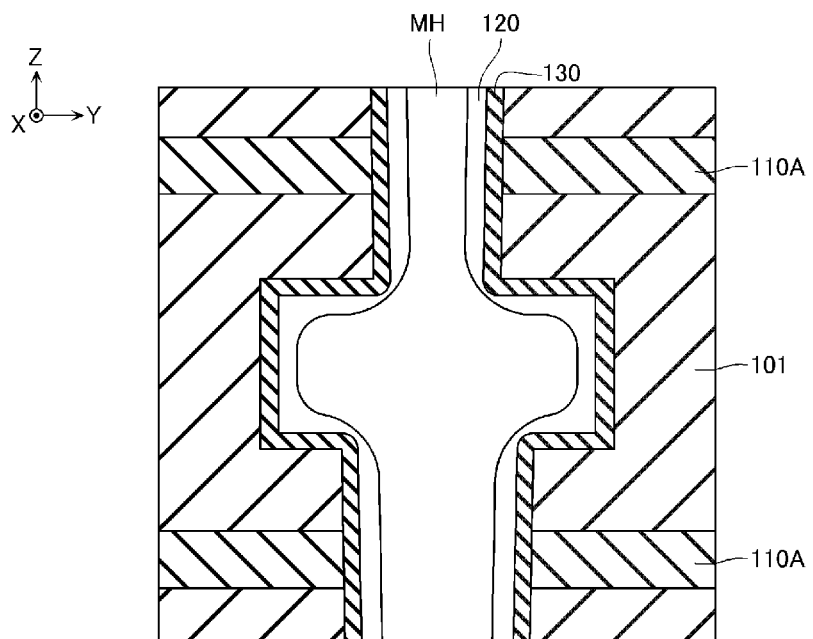
FIG. 34 is a schematic sectional view illustrating a manufacturing method of the memory die according to the third configuration example.
Figure 35:
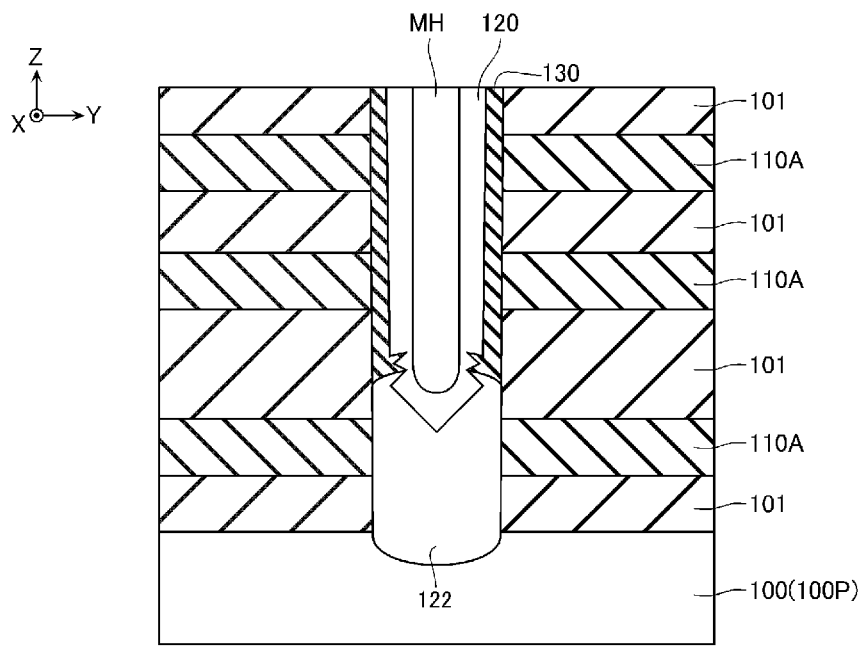
FIG. 35 is a schematic sectional view illustrating the same manufacturing method.

Next, the manufacturing method of the memory die according to the third configuration example will be described. The memory die according to the third configuration example can be basically manufactured in the same manner as the memory die MD according to the first configuration example. Meanwhile, when the memory die according to the third configuration example is manufactured, the steps described with reference to FIGS. 20 to 23 are not performed. After the steps described with reference to FIGS. 17 to 19 are performed, before the step described with reference to FIG. 24 is performed, for example, as illustrated in FIGS. 34 and 35, a part of the semiconductor layer 120 is removed. This step is performed by, for example, wet etching.

[Comparison Between First to Third Configuration Examples]

As described above, in manufacturing the memory dies according to the first to third configuration examples, the steps described with reference to FIGS. 17 to 19 are performed. In the steps described with reference to FIGS. 17 to 19, as described above, a semiconductor film of amorphous silicon is formed inside the memory hole MH, and then the crystal structure of this semiconductor layer is modified through annealing treatment.

Here, at the timing of annealing treatment, the larger the thickness of the semiconductor film of amorphous silicon, the larger the sizes of crystal grains in the semiconductor layers 120, 220, and 320 in the finished products. Accordingly, when a voltage is applied to the conductive layers 110, the current flowing through the semiconductor layer 120 (hereinafter, in some cases, referred to as an "ON current") may be increased. Meanwhile, the smaller the thicknesses of the semiconductor layers 120, 220, and 320 in the finished products, the smaller the current flowing through the semiconductor layers 120, 220, and 320 when a voltage is not applied to the conductive layers 110 (hereinafter, in some cases, referred to as an "OFF current" or a "leakage current").

Here, in the memory die manufacturing process according to the second configuration example, the steps described with reference to FIGS. 20 to 23 are not performed. Therefore, in the second configuration example, the thickness of the semiconductor layer formed in the steps described with reference to FIGS. 17 to 19 is substantially the same as the thickness of the semiconductor layer 220 in the finished product (the thickness described with reference to FIGS. 30 and 31).

Meanwhile, in the memory die manufacturing process according to the third configuration example, the semiconductor layer is formed in the steps described with reference to FIGS. 17 to 19, and then a part of the semiconductor layer 120 is removed through the steps described with reference to FIGS. 34 and 35. Therefore, in the third configuration example, the thickness of the semiconductor layer formed in the steps described with reference to FIGS. 17 to 19 is larger than the thickness of the semiconductor layer 320 in the finished product (the thickness described with reference to FIGS. 32 and 33). According to such a method, it is possible to manufacture a memory die having a large ON current and a small OFF current (leakage current).

However, in the memory die manufacturing process according to the third configuration example, it may be difficult to adjust the thickness of the semiconductor layer 120 in the steps described with reference to FIGS. 34 and 35.

Figure 36:
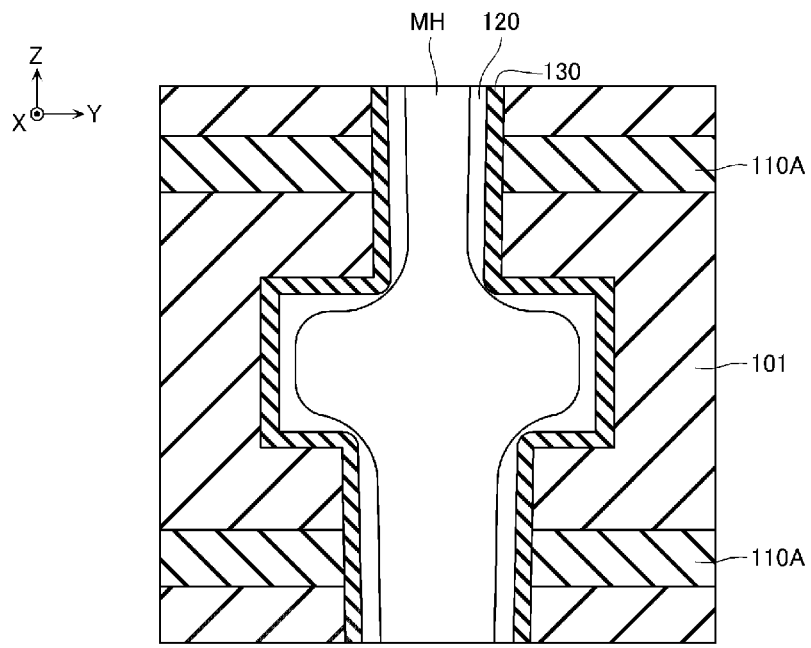
FIG. 36 is a schematic sectional view illustrating the same manufacturing method.
Figure 37:
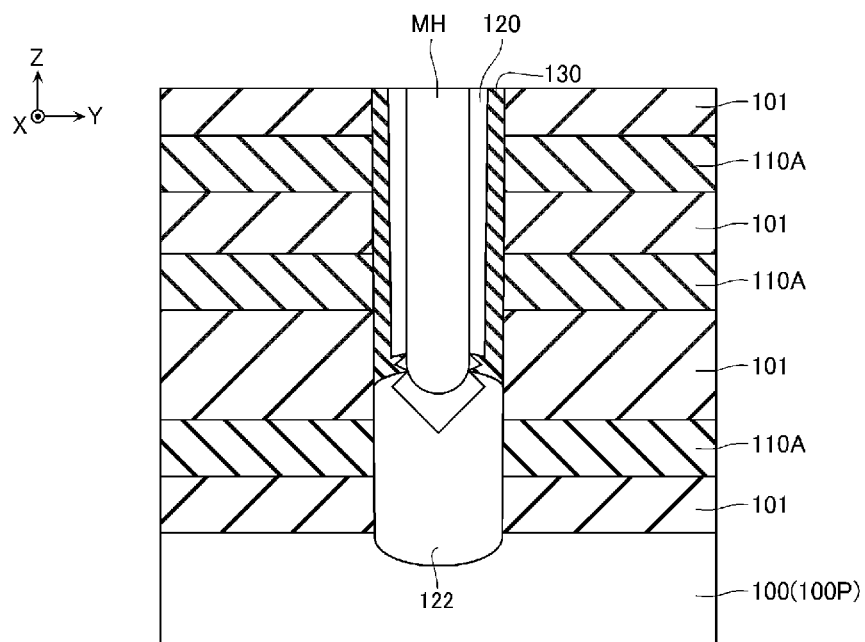
FIG. 37 is a schematic sectional view illustrating the same manufacturing method.

For example, portions of the semiconductor layer 120 formed in the corner portions within the memory hole MH may be removed earlier than other portions. In this case, for example, in the steps described with reference to FIGS. 34 and 35, for example, as illustrated in FIGS. 36 and 37, the semiconductor layer 120 may be vertically divided at such corner portions. Accordingly, the yield of the memory die may be degraded.

Here, in the manufacturing process of the memory die MD according to the first configuration example, in the steps described with reference to FIGS. 20 and 21, a part of the semiconductor layer 120 is oxidized to form the oxide film 120B, and then the oxide film 120B is selectively removed through the steps described with reference to FIGS. 22 and 23. Therefore, in the first configuration example as well, the thickness of the semiconductor layer formed in the steps described with reference to FIGS. 17 to 19 is larger than the thickness of the semiconductor layer 120 in the finished product (the thickness described with reference to FIGS. 4 and 5). Therefore, it is possible to manufacture the memory die having a large ON current and a small OFF current (leakage current).

According to such a method, it is possible to prevent the phenomenon (a phenomenon in which portions of the semiconductor layer 120 formed in the corner portions within the memory hole MH are removed earlier than other portions) that may occur during the manufacturing of the memory die according to the third configuration example. Therefore, it is possible to prevent degradation of the yield of the memory die.

Fourth Configuration Example

Figure 38:
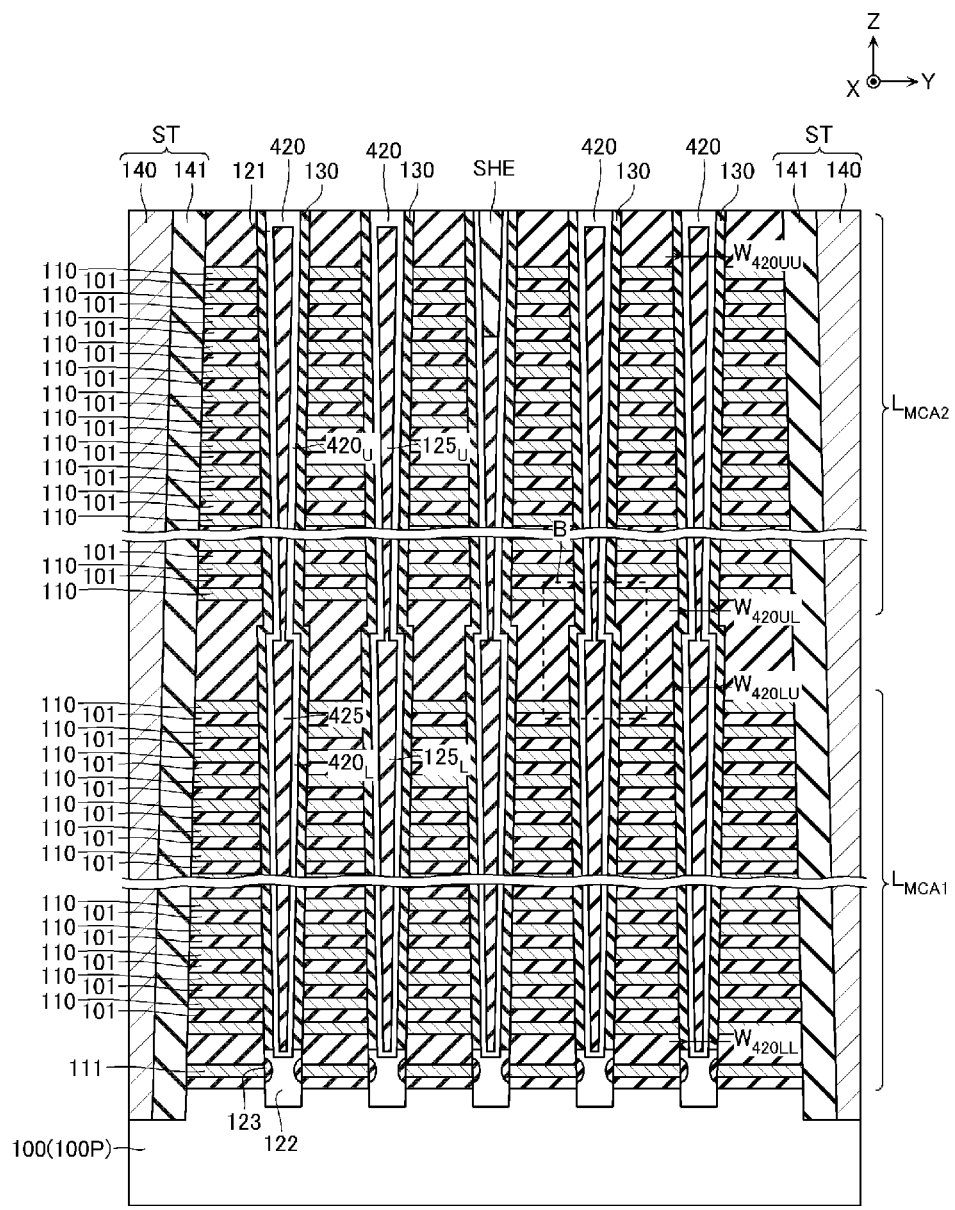
FIG. 38 is a schematic sectional view of a memory die according to a fourth configuration example.

FIG. 38 is a schematic sectional view illustrating a part of the configuration of a memory die according to a fourth configuration example. The memory die according to the fourth configuration example is basically configured in the same manner as the memory die MD according to the first configuration example. Meanwhile, the memory die according to the fourth configuration example does not include the semiconductor layers 120 and the insulating layers 125, and instead, includes semiconductor layers 420 and insulating layers 425.

The semiconductor layers 420 are arranged with a predetermined pattern in the X direction and the Y direction. The semiconductor layer 420 functions as a channel region of a plurality of memory cells. The semiconductor layer 420 is a semiconductor layer of, for example, polycrystalline silicon (Si). The semiconductor layer 420 has a substantially bottomed-cylindrical shape, and the insulating layer 425 of silicon oxide is provided in the central portion.

The semiconductor layer 420 includes a region $420_L$ in the memory cell array layer $L_{MCA1}$, and a region $420_U$ in the memory cell array layer $L_{MCA2}$. The semiconductor layer 420 includes the impurity region 121 provided in the upper portion in the region $420_U$.

The region $420_L$ is a substantially cylindrical region extending in the Z direction. The outer peripheral surface of the region $420_L$ is surrounded by each of the conductive layers 110 in the memory cell array layer $L_{MCA1}$, and faces these conductive layers 110. The radial width $W_{420LL}$ of the lower end of the region $420_L$ (for example, a portion located below the plurality of conductive layers 110 in the memory cell array layer $L_{MCA1}$) is smaller than the radial width $W_{420LU}$ of the upper end of the region $420_L$ (for example, a portion located above the plurality of conductive layers 110 in the memory cell array layer $L_{MCA1}$).

The region $420_U$ is a substantially cylindrical region extending in the Z direction. The outer peripheral surface of the region $420_U$ is surrounded by each of the conductive layers 110 in the memory cell array layer $L_{MCA2}$, and faces these conductive layers 110. The radial width $W_{420UL}$ of the lower end of the region $420_U$ (for example, a portion located below the plurality of conductive layers 110 in the memory cell array layer $L_{MCA2}$) is smaller than the radial width $W_{420UU}$ of the upper end of the region $420_U$ (for example, a portion located above the plurality of conductive layers 110 in the memory cell array layer $L_{MCA2}$) and the width $W_{420LU}$.

The insulating layer 425 is basically configured in the same manner as the insulating layer 125 according to the first configuration example. Meanwhile, the insulating layer 425 does not include the above described region $125_f$.

[Thickness of Semiconductor Layer 420]

Figure 39:
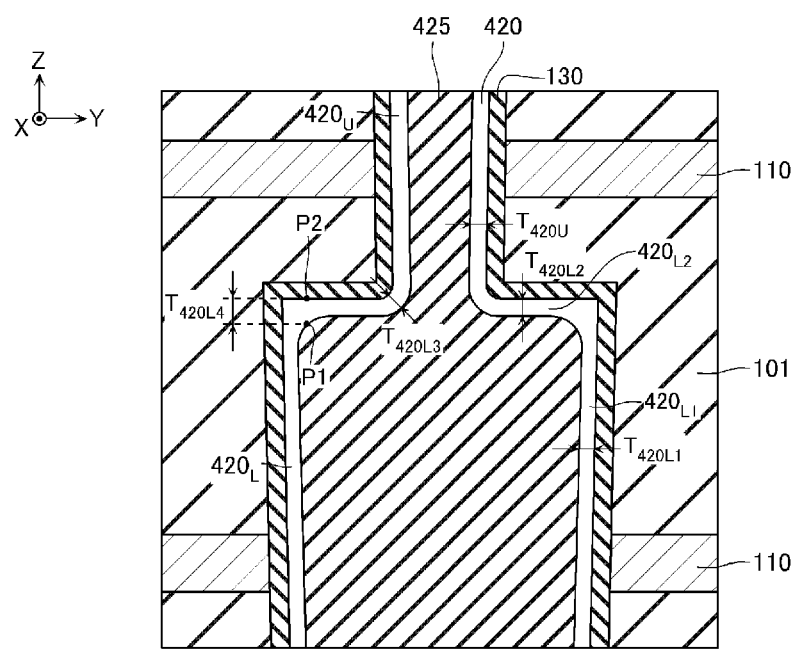
FIG. 39 is a schematic view of a portion indicated by B in FIG. 38, in an enlarged scale.

Next, the thickness of the semiconductor layer 420 will be described with reference to FIG. 39. FIG. 39 is a schematic view of a portion indicated by B in FIG. 38, in an enlarged scale.

In the example of FIG. 39, the region $420_L$ of the semiconductor layer 420 includes a region $420_{L1}$ that is provided between the plurality of conductive layers 110 and the insulating layer 425 and extends in the Z direction, and a region $420_{L2}$ that is provided between the upper end of the region $420_{L1}$ and the lower end of the region $420_U$ and extends radially inward from the upper end of the region $420_{L1}$.

In the illustrated example, the thickness of the semiconductor layer 420 in the region $420_{L1}$ is indicated by $T_{420L1}$. The thickness of the semiconductor layer 420 in the region $420_{L2}$ is indicated by $T_{420L2}$. The thickness of the semiconductor layer 420 in the region $420_U$ is indicated by $T_{420U}$. In the illustrated example, the thicknesses $T_{420L1}$, $T_{420L2}$, and $T_{420U}$ are the same as each other. For example, these thicknesses may be the same in the range of one-digit or two-digit significant figures.

In the illustrated example, the thickness of the semiconductor layer 420 in a portion provided between the region $420_{L2}$ and the region $420_U$ is indicated by $T_{420L3}$. The thickness $T_{420L3}$ may be substantially the same as the thicknesses $T_{420L1}$, $T_{420L2}$, and $T_{420U}$, or may be smaller than these thicknesses. For example, the thickness $T_{420L3}$ may be the same as any of the thicknesses $T_{420L1}$, $T_{420L2}$, and $T_{420U}$ in the range of one-digit or two-digit significant figures. The thickness $T_{420L3}$ may be the same as the value obtained by subtracting 2 nm from these thicknesses, or may be larger than this value. The thickness $T_{420L3}$ may be the minimum value or the smallest value among the thicknesses of the semiconductor layer 420.

In the illustrated example, the thickness of the semiconductor layer 420 in a portion provided between the region $420_{L1}$ and the region $420_{L2}$ is indicated by $T_{420L4}$. The thickness $T_{420L4}$ is larger than any of the above described thicknesses $T_{420L1}$, $T_{420L2}$, and $T_{420U}$. For example, the thickness $T_{420L4}$ may be larger than the thicknesses $T_{420L1}$, $T_{420L2}$, and $T_{420U}$ in the range of one-digit or two-digit significant figures. The thickness $T_{420L4}$ may be the maximum value or the largest value among the thicknesses of the semiconductor layer 420. In the illustrated example, a point P1 is set on the inside surface of the semiconductor layer 420 (on the side of the insulating layer 425), and a point P2 is set for a point at which a distance to the point P1 is minimized on the outside surface of the semiconductor layer 420 (on the side of the conductive layer 110 and the insulating layer 101), so that the distance between the point P1 and the point P2 is set as the thickness $T_{420L4}$.

Next, the manufacturing method of the memory die according to the fourth configuration example will be described. The memory die according to the fourth configuration example can be basically manufactured in the same manner as the memory die MD according to the first configuration example. Meanwhile, when the memory die according to the fourth configuration example is manufactured, the steps described with reference to FIGS. 9 to 11 are not performed.

Fifth Configuration Example

Figure 40:
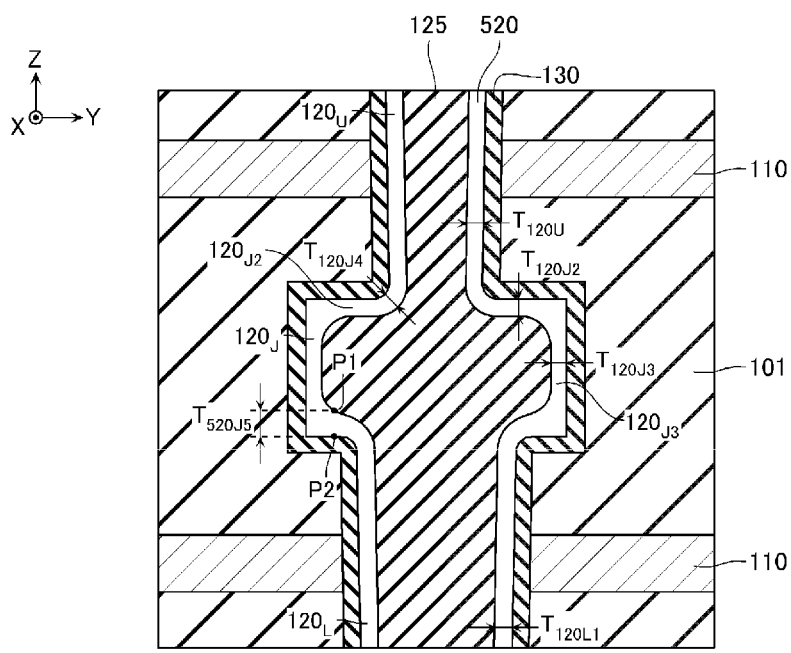
FIG. 40 is a schematic sectional view of a memory die according to a fifth configuration example.

FIG. 40 is a schematic sectional view illustrating a part of the configuration of a memory die according to a fifth configuration example. The memory die according to the fifth configuration example is basically configured in the same manner as the memory die MD according to the first configuration example. Meanwhile, the memory die according to the fifth configuration example does not include the semiconductor layer 120, and instead, includes a semiconductor layer 520. The semiconductor layer 520 is basically configured in the same manner as the semiconductor layer 120 according to the first configuration example. Meanwhile, the semiconductor layer 520 according to the fifth configuration example does not include the region $120_{J1}$.

In the illustrated example, the thickness of the semiconductor layer 520 in a portion provided between the region $120_L$ and the region $120_{J3}$, and the thickness in a portion provided between the region $120_{J2}$ and the region $120_{J3}$ are indicated by $T_{520J5}$. The thickness $T_{520J5}$ is larger than any one of the above described thicknesses $T_{120L1}$, $T_{120U}$, $T_{120J2}$, $T_{120J3}$, and $T_{120J4}$. For example, the thickness $T_{520J5}$ may be larger than the thicknesses $T_{120L1}$, $T_{120U}$, $T_{120J2}$, $T_{120J3}$, and $T_{120J4}$ in the range of one-digit or two-digit significant figures. The thickness $T_{520J5}$ may be the maximum value or the largest value among the thicknesses of the semiconductor layer 520. In the illustrated example, a point P1 is set on the inside surface of the semiconductor layer 520 (on the side of the insulating layer 125), and a point P2 is set for a point at which a distance to the point P1 is minimized on the outside surface of the semiconductor layer 520 (on the side of the conductive layer 110 and the insulating layer 101) so that the distance between the point P1 and the point P2 is set as the thickness $T_{520J5}$.

Sixth Configuration Example

Figure 41:
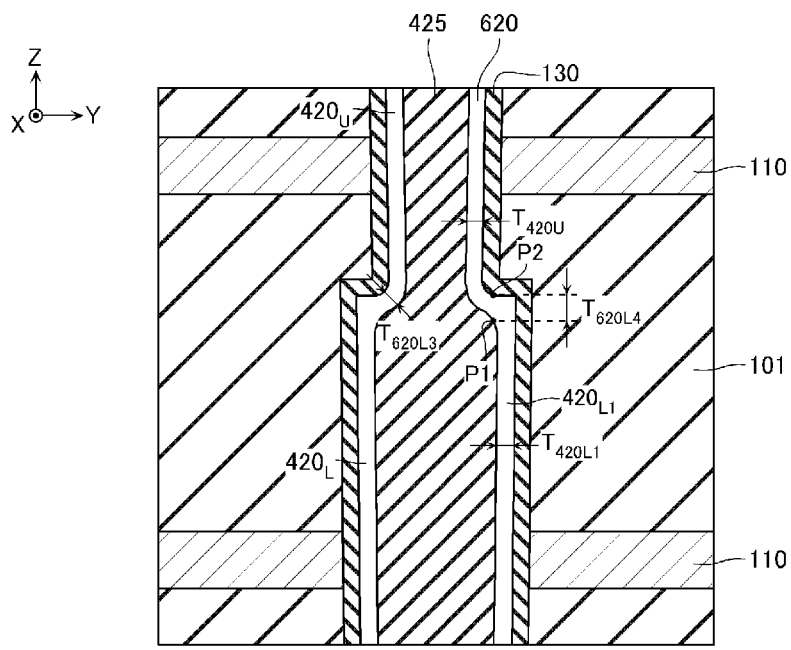
FIG. 41 is a schematic sectional view of a memory die according to a sixth configuration example.

FIG. 41 is a schematic sectional view illustrating a part of the configuration of a memory die according to a sixth configuration example. The memory die according to the sixth configuration example is basically configured in the same manner as the memory die MD according to the fourth configuration example. Meanwhile, the memory die according to the sixth configuration example does not include the semiconductor layer 420, and instead, includes a semiconductor layer 620. The semiconductor layer 620 is basically configured in the same manner as the semiconductor layer 420 according to the fourth configuration example. Meanwhile, the semiconductor layer 620 according to the sixth configuration example does not include the region $420_{L2}$.

In the illustrated example, the thickness of the semiconductor layer 620 in a portion provided at the lower end of the region $420_U$ is indicated by $T_{620L3}$. The thickness $T_{620L3}$ may be substantially the same as the thicknesses $T_{420L1}$, and $T_{420U}$, or may be smaller than these thicknesses. For example, the thickness $T_{620L3}$ may be the same as any one of the thicknesses $T_{420L1}$ and $T_{420U}$ in the range of one-digit or two-digit significant figures. The thickness $T_{620L3}$ may be the same as the value obtained by subtracting 2 nm from these thicknesses, or may be larger than this value. The thickness $T_{620L3}$ may be the minimum value or the smallest value among the thicknesses of the semiconductor layer 620.

In the illustrated example, the thickness of the semiconductor layer 620 in a portion provided at the upper end of the region $420_{L1}$ is indicated by $T_{620L4}$. The thickness $T_{620L4}$ is larger than any one of the above described thicknesses $T_{420L1}$ and $T_{420U}$. For example, the thickness $T_{620L4}$ may be larger than the thicknesses $T_{420L1}$ and $T_{420U}$ in the range of one-digit or two-digit significant figures. The thickness $T_{620L4}$ may be the maximum value or the largest value among the thicknesses of the semiconductor layer 620. In the illustrated example, a point P1 is set on the inside surface of the semiconductor layer 620 (on the side of the insulating layer 425), and a point P2 is set for a point at which a distance to the point P1 is minimized on the outside surface of the semiconductor layer 620 (on the side of the conductive layer 110 and the insulating layer 101), so that the distance between the point P1 and the point P2 is set as the thickness $T_{620L4}$.

Other Embodiments

So far, semiconductor storage devices according to some configuration examples and their manufacturing methods were described. However, these semiconductor storage devices and their manufacturing methods are merely examples, and specific embodiments are properly adjustable.

For example, the above described semiconductor layers 120, 220, 320, 420, 520, and 620 are electrically connected to the semiconductor substrate 100 via the semiconductor layer 122. However, such a configuration is merely an example, and a specific configuration is properly changeable. For example, the semiconductor layer 122 can be omitted. The above described semiconductor layers 120, 220, 320, 420, 520, and 620 may be electrically connected to a semiconductor layer extending in at least one of the X direction and the Y direction, instead of the semiconductor substrate 100.

For example, as for the manufacturing methods of the semiconductor storage devices according to the first configuration example, and the fourth to sixth configuration examples, an example in which the steps described with reference to FIGS. 20 to 23 are executed once was described. However, such methods are merely examples, and specific methods are properly changeable. For example, the steps described with reference to FIGS. 20 to 23 may be divided and repeatedly performed a plurality of times. In the steps described with reference to FIGS. 20 and 21, nitriding treatment or other treatments may be performed instead of oxidation treatment so as to form a nitride film or other films. In the steps described with reference to FIGS. 22 and 23, the nitride film or other films may be selectively removed. When the film formed through the oxidation treatment, the nitriding treatment, or other treatments (for example, the oxide film 120B, the nitride film or other films) is an insulating film, the steps described with reference to FIGS. 22 and 23 may be omitted.

For example, in manufacturing the semiconductor storage devices according to the first to sixth configuration examples, the plurality of sacrifice layers 120A and the insulating layers 101 are formed in the steps described with reference to FIGS. 6 and 12, the sacrifice layers 120A are removed in the step described with reference to FIG. 27, and the conductive layers 110 are formed in the step described with reference to FIG. 29. However, such methods are merely examples, and specific methods are properly changeable. For example, a plurality of sacrifice layers and the conductive layers 110 may be formed in the steps described with reference to FIGS. 6 and 12, the sacrifice layers may be removed in the step described with reference to FIG. 27, and the insulating layers 101 may be formed in the step described with reference to FIG. 29. The plurality of conductive layers 110 and the insulating layers 101 may be formed in the steps described with reference to FIGS. 6 and 12, and the step described with reference to FIG. 27 and the step described with reference to FIG. 29 may be omitted.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a substrate;
   a plurality of conductive layers arranged in a first direction intersecting with a surface of the substrate;
   a first insulating layer extending in the first direction;
   a first semiconductor layer provided between the plurality of conductive layers and the first insulating layer; and
   a gate insulating film provided between the plurality of conductive layers and the first semiconductor layer,
   wherein a cross-section, extending in the first direction and a second direction intersecting with the first direction, in part includes a first one and a second one of the plurality of conductive layers that are adjacent to each other in the first direction, the first insulating layer, the first semiconductor layer, and the gate insulating film,
   the first insulating layer includes:
      a first insulating portion having a first width in the second direction, and
      a second insulating portion that has a second width smaller than the first width in the second direction, and is separated from the first insulating portion in the first direction, and
   the first semiconductor layer includes a first region provided between the first insulating portion and the first conductive layer, a second region provided between the second insulating portion and the second conductive layer, and a third region provided between the first region and the second region,
   the third region includes a fourth region extending in the second direction, a fifth region provided between the first region and the fourth region, a sixth region provided between the second region and the fourth region, and a seventh region provided between the fifth region and the first region and extending in the first direction,
   the first region of the first semiconductor layer has a first thickness from a surface on a side of the first insulating layer to the gate insulating film,
   the second region of the first semiconductor layer has a second thickness from a surface on the side of the first insulating layer to the gate insulating film,
   the seventh region of the first semiconductor layer has a third thickness from a surface on the side of the first insulating layer to the gate insulating film,
   a surface in the fifth region on the side of the first insulating layer includes a region with a shortest distance to the gate insulating film larger than the first thickness, the second thickness, and the third thickness, and
   a shortest distance to the gate insulating film from a surface in the sixth region on the side of the first insulating layer is larger than the first thickness minus 2 nm and is larger than the second thickness minus 2 nm.

2. The semiconductor storage device according to claim 1, wherein in the cross-section, a shortest distance to the gate insulating film from a surface in the third region on the side of the first insulating layer is equal to one of the first thickness or the second thickness.

3. The semiconductor storage device according to claim 1, wherein in the cross-section, a shortest distance to the gate insulating film from the surface in the sixth region on the side of the first insulating layer is equal to one of the first thickness or the second thickness.

4. The semiconductor storage device according to claim 1, wherein in the cross-section,
   a surface in the seventh region on the side of the first insulating layer includes a region with a shortest distance to the gate insulating film.

5. The semiconductor storage device according to claim 4, wherein in the cross-section, the shortest distance to the gate insulating film from the surface in the seventh region on the side of the first insulating layer is larger than the first thickness minus 2 nm, and larger than the second thickness minus 2 nm.

6. The semiconductor storage device according to claim 5, wherein in the cross-section, the shortest distance to the gate insulating film from the surface in the seventh region on the side of the first insulating layer is equal to one of the first thickness or the second thickness.

7. The semiconductor storage device according to claim 4, further comprising:
   a second semiconductor layer provided between the substrate and the first semiconductor layer, and connected to the substrate and the first semiconductor layer,
   wherein the seventh region is connected to the second semiconductor layer.

* * * * *